US012656810B2

(12) United States Patent (10) Patent No.: US 12,656,810 B2
Gaide (45) Date of Patent: Jun. 16, 2026

(54) CLOCK TREE ROUTING IN A CHIP STACK

(71) Applicant: XILINX, INC., San Jose, CA (US)

(72) Inventor: Brian C. Gaide, Erie, CO (US)

( * ) Notice: Subject to any disclaimer, the term of this patent is extended or adjusted under 35 U.S.C. 154(b) by 0 days.

(21) Appl. No.: 18/521,301

(22) Filed: Nov. 28, 2023

(65) Prior Publication Data

US 2024/0103562 A1 Mar. 28, 2024

Related U.S. Application Data

(63) Continuation of application No. 17/127,525, filed on Dec. 18, 2020, now Pat. No. 11,868,174.

(51) Int. Cl.
 *G06F 1/10* (2006.01)
 *H10W 72/90* (2026.01)
 *H10W 90/00* (2026.01)
(52) U.S. Cl.
 CPC .............. *G06F 1/10* (2013.01); *H10W 72/90* (2026.01); *H10W 90/792* (2026.01)
(58) Field of Classification Search
 CPC ........................................................ G06F 1/10
 USPC ........................................................ 327/291
 See application file for complete search history.

(56) References Cited

U.S. PATENT DOCUMENTS

| | | | |
|---|---|---|---|
| 9,143,122 B1 | 9/2015 | Gaide | |
| 10,741,524 B2 | 8/2020 | Gaide et al. | |
| 2013/0049827 A1 | 2/2013 | Bucelot et al. | |
| 2015/0061110 A1 * | 3/2015 | Hsu ........................ | G06F 30/394 |
| | | | 257/713 |
| 2019/0333892 A1 | 10/2019 | Gaide et al. | |

FOREIGN PATENT DOCUMENTS

WO WO-2011155333 A1 * 12/2011 ............... G06F 1/10

OTHER PUBLICATIONS

Office Action from EP 21758852.4 dated Sep. 27, 2024.
Japanese Office Action for Application No. 2023-536994 dated Apr. 1, 2025.
Korean Office Action for Application No. 10-2023-7015052 dated Feb. 10, 2026.

* cited by examiner

*Primary Examiner* — Tomi Skibinski

(57) ABSTRACT

Examples described herein generally relate to clock tree routing in a chip stack. In an example, a multi-chip device includes a chip stack. The chip stack includes chips. The chip stack includes a clock tree. In-chip routing of the clock tree is contained within one logical chip of the chip stack. The chip stack includes leaf nodes disposed in respective chips. Each leaf node of the leaf nodes is electrically connected to the clock tree through a respective leaf-level connection bridge. The respective leaf-level connection bridge extends in an out-of-chip direction through a plurality of the chips.

20 Claims, 12 Drawing Sheets

300

304    302                              304

310-14          310-24          310-34          310-44

310-13          310-23          310-33          310-43

310-12          310-22          310-32          310-42

312    314    316

310-11          310-21          310-31          310-41

Y

X

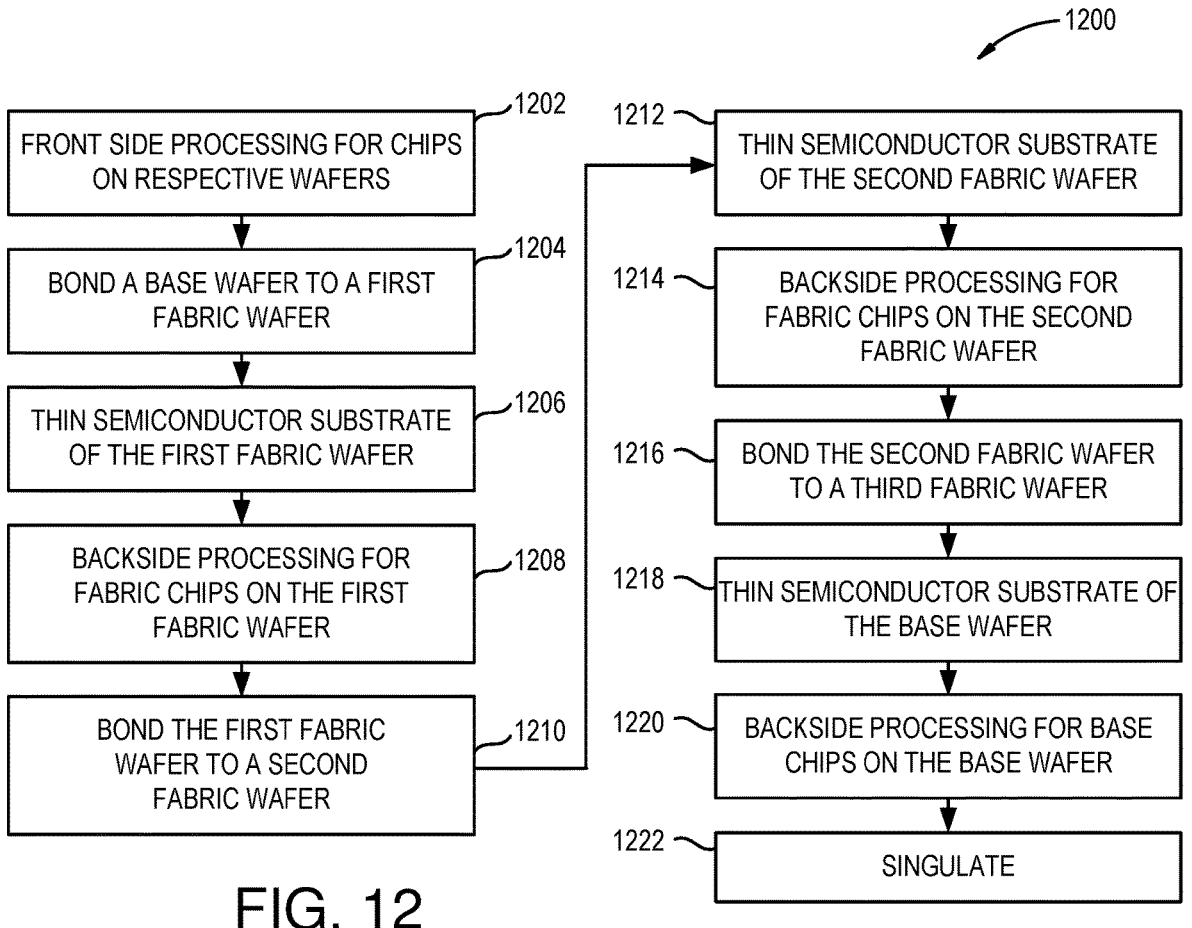

FRONT SIDE PROCESSING FOR CHIPS ON RESPECTIVE WAFERS ~1202

BOND A BASE WAFER TO A FIRST FABRIC WAFER ~1204

THIN SEMICONDUCTOR SUBSTRATE OF THE FIRST FABRIC WAFER ~1206

BACKSIDE PROCESSING FOR FABRIC CHIPS ON THE FIRST FABRIC WAFER ~1208

BOND THE FIRST FABRIC WAFER TO A SECOND FABRIC WAFER ~1210

1212 ~ THIN SEMICONDUCTOR SUBSTRATE OF THE SECOND FABRIC WAFER

1214 ~ BACKSIDE PROCESSING FOR FABRIC CHIPS ON THE SECOND FABRIC WAFER

1216 ~ BOND THE SECOND FABRIC WAFER TO A THIRD FABRIC WAFER

1218 ~ THIN SEMICONDUCTOR SUBSTRATE OF THE BASE WAFER

1220 ~ BACKSIDE PROCESSING FOR BASE CHIPS ON THE BASE WAFER

1222 ~ SINGULATE

FIG. 12

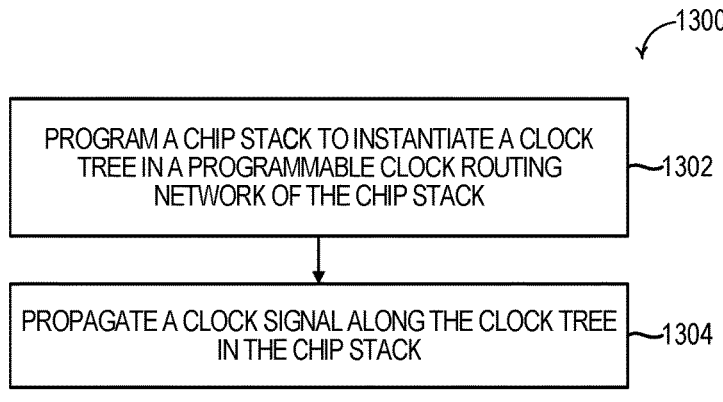

PROGRAM A CHIP STACK TO INSTANTIATE A CLOCK TREE IN A PROGRAMMABLE CLOCK ROUTING NETWORK OF THE CHIP STACK ~1302

PROPAGATE A CLOCK SIGNAL ALONG THE CLOCK TREE IN THE CHIP STACK ~1304

FIG. 13

CLOCK TREE ROUTING IN A CHIP STACK

CROSS REFERENCE TO RELATED APPLICATION

This Application is a continuation of U.S. Non-Provisional application Ser. No. 17/127,525, filed on Dec. 18, 2020, of which is incorporated herein by reference in its entirety.

TECHNICAL FIELD

Examples of the present disclosure generally relate to clock tree routing in a chip stack.

BACKGROUND

Apparatuses, including modules and/or packages, that include multiple integrated circuit chips have been developed. The forms of such apparatuses are varied. By forming such apparatuses, an electronic device can integrate multiple chips to form the device, where each chip can be manufactured using standard semiconductor processing to then be assembled and packaged to form a larger, multi-functional device. By having different chips, in some instances, semiconductor processing that is difficult to integrate can be separated, such as when parts of one chip require a different process from another chip.

Another aspect is an ability to build a device having chips with different functionalities (for example, some are field programmable gate array (FPGA) chips and some are memory chips) into a same apparatus with a smaller device size and more functionality and lower power. Semiconductor processes for a chip can be more focused to give devices a greater edge in areas such as increased performance of the chip, reduced costs, and increased yield in manufacturing. Other benefits can be realized by such apparatuses.

SUMMARY

Examples described herein generally relate to clock tree routing in a chip stack. Generally, in-chip routing of a clock tree in a chip stack that includes multiple chips is contained within one logical chip of the chip stack. According to some examples, having in-chip routing contained within one logical chip can reduce skew of a clock signal received at leaf nodes on different chips because skew from inter-wafer variation can be avoided by having the in-chip routing contained within one logical chip.

An example described herein is a multi-chip device. The multi-chip device includes a chip stack. The chip stack includes chips. The chip stack includes a clock tree. In-chip routing of the clock tree is contained within one logical chip of the chip stack. The chip stack includes leaf nodes disposed in respective chips. Each leaf node of the leaf nodes is electrically connected to the clock tree through a respective leaf-level connection bridge. The respective leaf-level connection bridge extends in an out-of-chip direction through a plurality of the chips.

Another example described herein is a multi-chip device. The multi-chip device includes a chip stack. The chip stack includes chips. The chip stack includes a programmable clock routing network. Programmable leaf-level connection bridges are disposed in the chip stack and electrically connected to the programmable clock routing network. The programmable leaf-level connection bridges extend in an out-of-chip direction through a plurality of the chips and are electrically connected to respective leaf nodes in each chip of the plurality of the chips.

Another example described herein is a method of operating a multi-chip device. A clock signal is propagated along a clock tree in a chip stack. The chip stack includes chips. In-chip routing of the clock tree is contained within one logical chip of the chip stack. The chip stack includes leaf nodes disposed in respective chips. Each leaf node of the leaf nodes is electrically connected to the clock tree through a respective leaf-level connection bridge. The respective leaf-level connection bridge extends in an out-of-chip direction through a plurality of the chips.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

FIG. 12 is a flowchart of a method of forming the multi-chip device of FIG. 1 according to some examples.

FIG. 13 is a flowchart of a method of operating a multi-chip device according to some examples.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
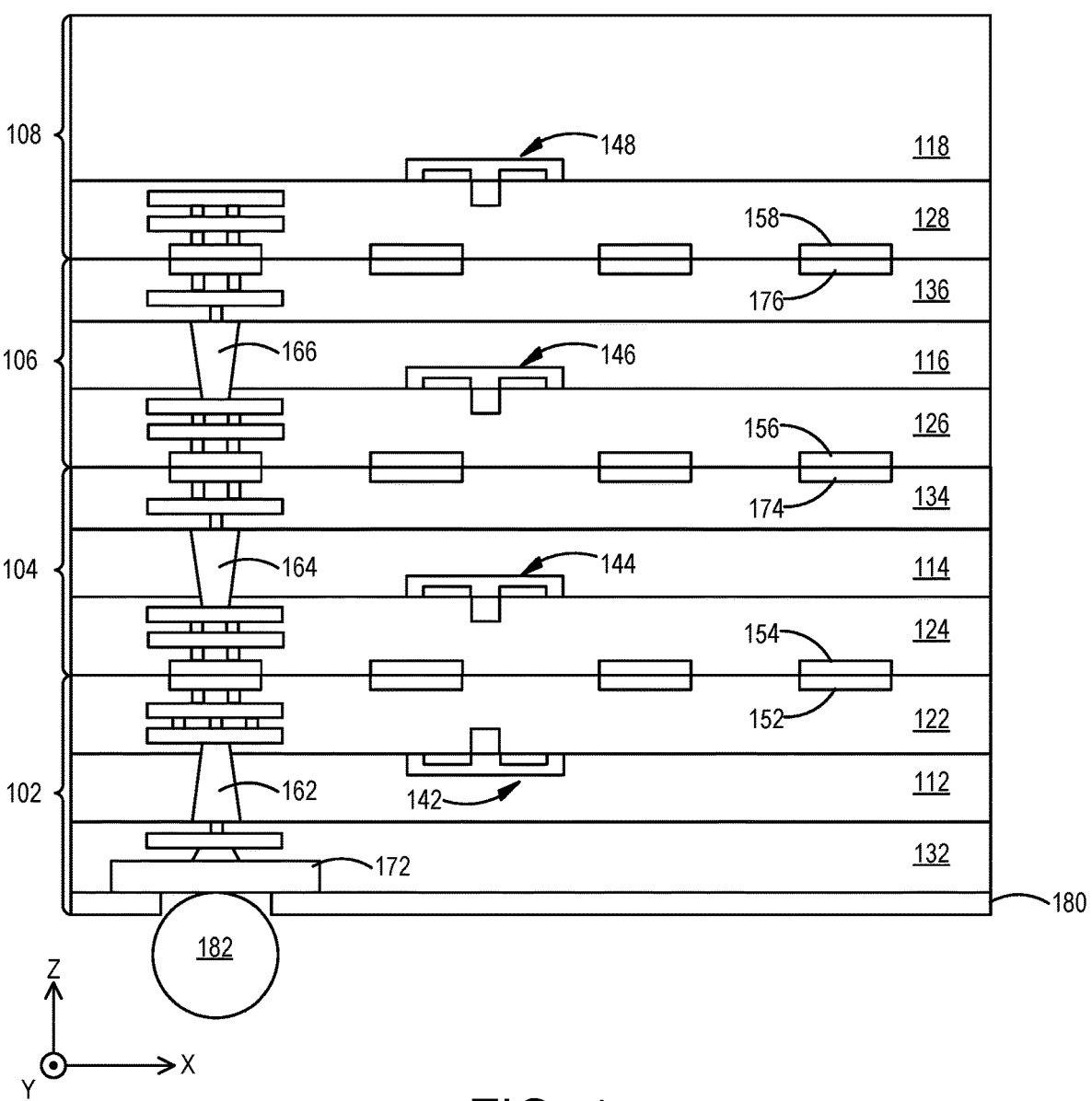
FIG. 1 is a structure of a multi-chip device having a chip stack according to some examples.

Examples described herein generally relate to clock tree routing in a chip stack. Generally, in-chip routing of a clock tree in a chip stack that includes multiple chips is contained within one logical chip of the chip stack. Conceptually, one logical chip is a collection of portions of one or more physical chips that, when operably electrically connected together, are capable of operating in a manner that is indistinguishable from operation of one physical chip from an end user's perspective. For example, in-chip routing of a clock tree to leaf level(s) is contained within one logical chip when, from a branching point (if any) of the clock tree, all of the branches of the clock tree have corresponding in-chip routing within a same physical chip to out-of-chip routing (if any) that are at respective generally same in-chip locations within that physical chip, and from that out-of-chip routing, corresponding in-chip routing of all of the branches is within another same physical chip, which out-of-chip routing can occur any number of times at respective in-chip locations with subsequent corresponding in-chip routing of all of the branches being within a same physical chip until the leaf level(s) are reached. Once the clock tree reaches the leaf level, leaf nodes are electrically connected to the clock tree through out-of-chip leaf-level connection bridges that extend through chips of the chip stack. According to some examples, having in-chip routing contained within one logical chip can reduce skew of a clock signal received at leaf nodes on different chips because skew from inter-wafer variation can be avoided by having the in-chip routing contained within one logical chip.

Examples can be implemented in hardwired and/or non-programmable clock trees, such as in application specific integrated circuits (ASICs). Examples, such as described below, can be implemented using a programmable clock routing network. A person having ordinary skill in the art will readily understand how aspects described below are applicable to various examples.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described. Further, methods described herein may be described in a particular order of operations, but other methods according to other examples may be implemented in various other orders (e.g., including different serial or parallel performance of various operations) with more or fewer operations. Various components described as a "first", "second", etc. of the component does not connote or imply any structure or position resulting from the "first", "second", etc. "First", "second", etc. are used herein to easily refer to different components.

In the description that follows, various signals or data may be described in the context of the operation of various circuits. A described signal or data indicates a corresponding node on which the signal or data is applied or propagated and further indicates nodes that are communicatively coupled and/or electrically connected. For example, description of a signal or data output from a first circuit and input to a second circuit indicates an output node of the first circuit (on which the signal or data is output from the first circuit) is communicatively coupled and/or electrically connected to an input node of the second circuit (on which the signal or data is input to the second circuit). Explicit description of such nodes may be omitted in the following description, but a person having ordinary skill in the art will readily understand the presence of the nodes.

FIG. 1 is a structure of a multi-chip device according to some examples. The multi-chip device of FIG. 1 includes a chip stack that includes a base chip 102 and fabric chips 104, 106, 108. The base chip 102 and fabric chips 104-108 are described herein as examples. Although the different chips are described herein as being or including various integrated circuits (ICs) or components (e.g., fabric, base, programmable logic, etc.), aspects described herein can be generally applicable to chips of a multi-chip device having any type of IC or component.

In the multi-chip device of FIG. 1, the fabric chips 104-108 are arranged active or front side facing down towards the base chip 102, where the base chip 102 is arranged active or front side facing up towards the fabric chips 104-108. In other multi-chip devices, intermediate fabric chips are arranged active or front side facing up away from the base chip 102, and a distal fabric chip is arranged active or front side facing down towards the base chip 102, where the base chip 102 is arranged active or front side facing up towards the fabric chips 104-108. Various other multi-chip devices can have different structures, different number of chips, additional components, etc.

Generally, the chips 102-108 are stacked and form a chip stack in the multi-chip device. The chips 102-108 are stacked to form, in some examples, an Active die-on-Active die (AoA) device. Each of the chips 102-108 can include an active IC. In some examples, more or fewer chips can be included in the chip stack. For example, a multi-chip device can have two chips, such as a base chip and a fabric chip, or two fabric chips. In other examples, a multi-chip device can have three chips, four chips, five chips, etc.

Each of the chips 102-108 includes a respective semiconductor substrate 112, 114, 116, 118 and respective front side dielectric layer(s) 122, 124, 126, 128 on a front side of the respective semiconductor substrate 112-118. The front side dielectric layer(s) 122-128 include metallization (e.g., metal lines and/or vias) (illustrated but not specifically numbered) formed therein which can electrically connect various components in an IC. Each of the chips 102-106 includes respective backside dielectric layer(s) 132, 134, 136 on a backside of the respective semiconductor substrate 112-116. The backside dielectric layer(s) 132-136 include metallization (e.g., metal lines and/or vias) (illustrated but not specifically numbered) formed therein which can electrically connect various components in an IC. Metallization in front side dielectric layer(s) 124, 126, 128 of the fabric chips 104, 106, 108 electrically connect to respective circuit regions of the fabric chips 104, 106, 108 in which respective active circuits can be formed.

Each semiconductor substrate 112-118 of the chips 102-108 includes, e.g., a transistor 142, 144, 146, 148 formed on and/or in the front side surface of the respective semiconductor substrate 112-118. The transistor 142-148 and any other components can be connected to the metallization in the front side dielectric layer(s) 122-128. Each semiconductor substrate 112-116 of the respective chip 102-106 has backside through-substrate via(s) (TSV(s)) 162, 164, 166 therethrough, which can electrically connect the metallization in the front side dielectric layer(s) 122-126 to the metallization in the backside dielectric layer(s) 132-136 of the respective chip 102-106.

Front side bond pads 152, 154, 156, 158 (e.g., metal (e.g., Cu) bond pads) are formed in the respective front side dielectric layer(s) 122-128 of the chips 102-108 at an exterior surface distal from the respective semiconductor substrate 112-118. The front side bond pads 152-158 can be in an arrangement that forms a respective chip-to-chip interface. The front side bond pads 152-158 are connected to the metallization in the respective front side dielectric layer(s) 122-128. Backside bond pads 174, 176 (e.g., metal (e.g., Cu) bond pads) are formed in the respective backside dielectric layer(s) 134, 136 of the fabric chips 104, 106 at an exterior surface distal from the respective semiconductor substrate 114, 116. The backside bond pads 174, 176 can be in an arrangement that forms a respective chip-to-chip interface. The backside bond pads 174, 176 are connected to the metallization in the respective backside dielectric layer(s) 134, 136.

Exterior connector backside pads 172 (e.g., metal (e.g., aluminum) pads) are formed in the backside dielectric layer(s) 132 of the base chip 102 at an exterior surface distal from the semiconductor substrate 112 of the base chip 102. The exterior connector backside pads 172 are connected to the metallization in the backside dielectric layer(s) 132 of the base chip 102. A passivation layer 180 is formed on the exterior surface distal from the semiconductor substrate 112 of the base chip 102 with respective openings therethrough exposing the exterior connector backside pads 172. External connectors 182 (e.g., controlled collapse chip connections (C4), minibumps, etc.) are formed on respective exterior connector backside pads 172 through the openings in the passivation layer 180.

The external connectors 182 can be attached to a package substrate. The package substrate may further be attached to, e.g., a printed circuit board (PCB) to attach the package substrate (and hence, the multi-chip device) to the PCB. Various other components can be included in a multi-chip device. For example, an interposer, an encapsulant (such as a molding compound (MUF) or the like), etc. can be included in the multi-chip device. A person having ordinary skill in the art will readily envision various modifications that can be made to the multi-chip device.

The chips 102-108 are bonded (e.g., by hybrid bonding using metal-to-metal and oxide-to-oxide bonding) together to form a chip stack. The base chip 102 is bonded to the fabric chip 104 front side to front side such that the front side bond pads 152 and exterior surface of the front side dielectric layer(s) 122 of the base chip 102 are bonded to the front side bond pads 154 and exterior surface of the front side dielectric layer(s) 124 of the fabric chip 104. The fabric chip 104 is bonded to the fabric chip 106 backside to front side such that the backside bond pads 174 and exterior surface of the backside dielectric layer(s) 134 of the fabric chip 104 are bonded to the front side bond pads 156 and exterior surface of the front side dielectric layer(s) 126 of the fabric chip 106. The fabric chip 106 is bonded to the fabric chip 108 backside to front side such that the backside bond pads 176 and exterior surface of the backside dielectric layer(s) 136 of the fabric chip 106 are bonded to the front side bond pads 158 and exterior surface of the front side dielectric layer(s) 128 of the fabric chip 108.

Other arrangements of bonding can be implemented. For example, the base chip 102 can be bonded to the fabric chip 104 front side to backside such that the front side bond pads 152 and exterior surface of the front side dielectric layer(s) 122 of the base chip 102 are bonded to the backside bond pads 174 and exterior surface of the backside dielectric layer(s) 134 of the fabric chip 104. The fabric chip 104 can be bonded to the fabric chip 106 front side to backside such that the front side bond pads 154 and exterior surface of the front side dielectric layer(s) 124 of the fabric chip 104 are bonded to the backside bond pads 176 and exterior surface of the backside dielectric layer(s) 136 of the fabric chip 106. The fabric chip 106 can be bonded to the fabric chip 108 front side to front side such that the front side bond pads 156 and exterior surface of the front side dielectric layer(s) 126 of the fabric chip 106 are bonded to the front side bond pads 158 and exterior surface of the front side dielectric layer(s) 128 of the fabric chip 108.

In other examples, the chips 102-108 can be attached together using external connectors (such as minibumps, solder, etc.). In some examples, some of the chips 102-108 can be attached together by external connectors while others of the chips can be bonded together without use of external connectors. Any permutation of bonding and use of external connectors can be implemented.

In some examples, each of the fabric chips 104-108 includes a processing IC. A processing IC can generally include any circuit configured to or configurable to process any data and/or signal and output data and/or a signal resulting from that processing, and is more than merely memory and any circuit ancillary to memory (e.g., address decoder, memory controller, etc.). The processing IC of the fabric chips 104-108 is generally a same IC. The hardware topology, architecture, and layout of the fabric chips 104-108 can be the same in some examples, except that the distal fabric chip 108 may omit components formed by backside processing, such as backside TSVs, backside dielectric layer(s), and/or metallization in backside dielectric layer(s). In some examples, the processing IC of the fabric chips 104-108 includes one or more programmable logic regions (e.g., fabric of a FPGA), which has the same hardware topology, architecture, and layout between the fabric chips 104-108. Having Z-interfaces in the fabric chips 104-108 can permit chips undergoing a same front side processing to be integrated in a multi-chip device.

In other examples, the chips 102-108 can each be or include a different IC or can have any permutation of including a same IC and/or different ICs. For example, any of the fabric chips 104-108 can be or include a processing IC or memory. In some examples, the chip 108 is an ASIC. Any chip 102-108 may generically be referred to as an active chip.

Figure 2:
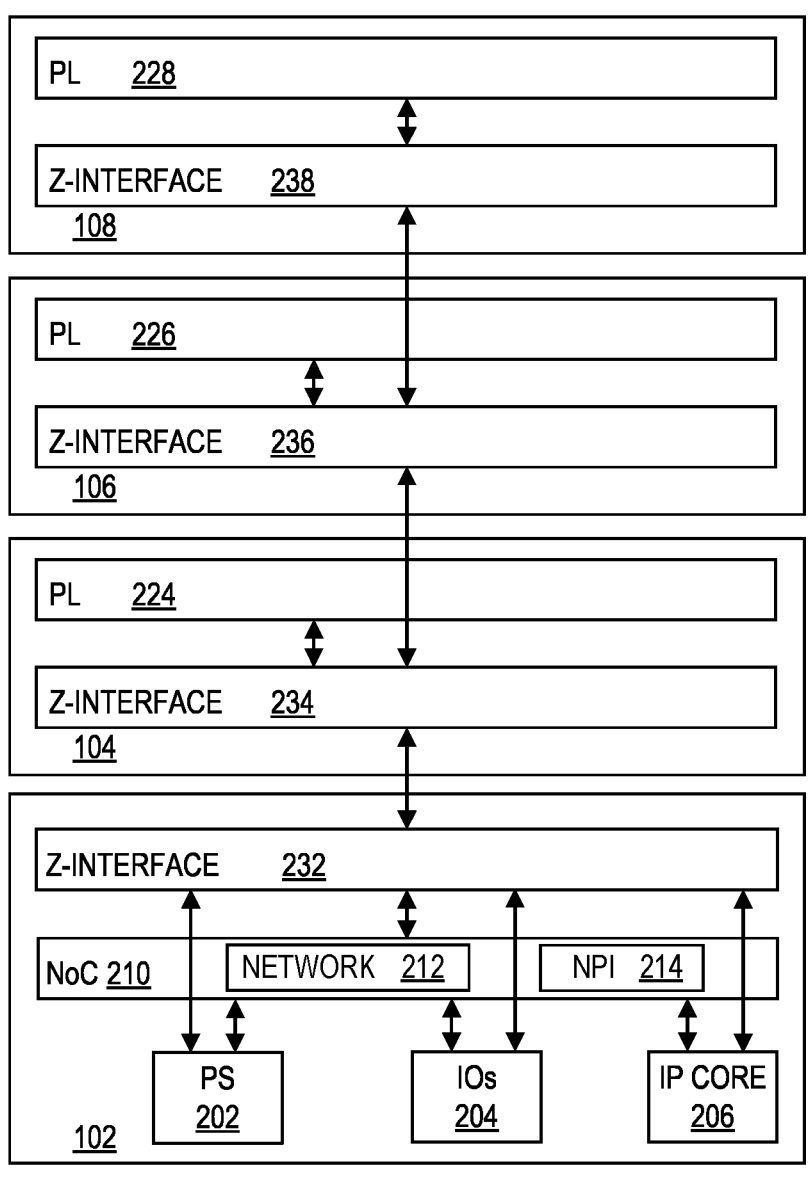
FIG. 2 is a block diagram of a circuit schematic depicting integrated circuits of the chip stack of the multi-chip device of FIG. 1 according to some examples.

FIG. 2 is a block diagram of a circuit schematic depicting ICs of a chip stack of the multi-chip device of FIG. 1 according to some examples. In the illustrated example, the multi-chip device is a multi-chip programmable device. The circuit schematic can be implemented in the multi-chip device of FIG. 1, e.g., regardless of the orientation of the fabric chips 104, 106.

In the illustrated example, the base chip 102 includes a base IC on the base chip 102, which may be a SoC. The fabric chips 104, 106, 108 include a respective programmable logic (PL) IC 224, 226, 228, which, in some examples, is a same IC and has a same hardware layout and topology. These ICs are provided as an example implementation. Other ICs (e.g., with other hard IP blocks) can be implemented in the chips. The fabric chips 104, 106, 108 further include a respective Z-interface 234, 236, 238.

The base IC on the base chip 102 includes a processing system 202, input/output circuits (IOs) 204, IP core circuits 206, a Network-on-Chip (NoC) 210, and a Z-interface 232. The processing system 202 may be or include any of a variety of different processor types and number of processor cores. For example, the processing system 202 may be implemented as an individual processor, e.g., a single core capable of executing program instruction code. In another example, the processing system 202 may be implemented as a multi-core processor. The processing system 202 may be implemented using any of a variety of different types of architectures. Example architectures that may be used to implement the processing system 202 may include an ARM processor architecture, an x86 processor architecture, a graphics processing unit (GPU) architecture, a mobile processor architecture, a reduced instruction set computer (RISC) architecture (e.g., RISC-V), or other suitable architecture that is capable of executing computer-readable program instruction code.

The input/output circuits 204 can include eXtreme Performance Input/Output (XPIO), multi-gigabit transceivers (MGTs), high bandwidth memory (HBM) interfaces, Analog-to-Digital Converters (ADC), Digital-to-Analog Converters (DAC), or any other input/output blocks. The input/output circuits 204 can be configured to receive and/or transmit signals from and/or to a circuit outside of the multi-chip device. The IP core circuits 206 can include memory controllers (such as double data rate (DDR) memory controllers, high bandwidth memory (HBM) memory controllers, or the like), peripheral component interconnect express (PCIe) interfaces, cache coherent interconnect for accelerators (CCIX) interfaces, Ethernet cores (such as a media address controller (MAC) or the like), forward error correction (FEC) blocks, and/or any other hardened circuit. Any of the input/output circuits 204 and/or IP core circuits 206 can be programmable.

The NoC 210 includes a programmable network 212 and a NoC peripheral interconnect (NPI) 214. The programmable network 212 communicatively couples subsystems and any other circuits of the base IC on the base chip 102 together. The programmable network 212 includes NoC packet switches and interconnect lines connecting the NoC packet switches. Each NoC packet switch performs switching of NoC packets in the programmable network 212. The programmable network 212 has interface circuits at the edges of the programmable network 212. The interface circuits include NoC master units (NMUs) and NoC slave units (NSUs). Each NMU is an ingress circuit that communicatively couples a master circuit to the programmable network 212, and each NSU is an egress circuit that communicatively couples the programmable network 212 to a slave endpoint circuit. NMUs are communicatively coupled to NSUs via the NoC packet switches and interconnect lines of the programmable network 212. The NoC packet switches are connected to each other and to the NMUs and NSUs through the interconnect lines to implement a plurality of physical channels in the programmable network 212. The NoC packet switches, NMUs, and NSUs include register blocks that determine the operation of the respective NoC packet switch, NMU, or NSU.

The NPI 214 includes circuitry to write to register blocks that determine the functionality of the NMUs, NSUs, and NoC packet switches. The NPI 214 includes a peripheral interconnect coupled to the register blocks for programming thereof to set functionality. The register blocks in the NMUs, NSUs, and NoC packet switches of the programmable network 212 support interrupts, quality of service (QoS), error handling and reporting, transaction control, power management, and address mapping control. The NPI 214 can include an NPI root node residing on the processing system 202 (e.g., a platform management controller (PMC) of the processing system 202), interconnected NPI switches communicatively coupled to the NPI root node, and protocol blocks connected to the interconnected NPI switches and a corresponding register block. The NPI 214 may be used to program any programmable circuit of the base IC on the base chip 102. For example, the NPI 214 may be used to program any input/output circuit 204 and/or IP core circuit 206 that is programmable.

The Z-interface 232 can include active circuits, such as buffers to drive signals. The Z-interface 232 provides an interface, including through metal lines/pads and vias in metallization layers, for the processing system 202, input/output circuits 204, IP core circuits 206, and programmable network 212 of the NoC 210 to chips overlying the base chip 102 and/or a substrate (e.g., package substrate) underlying the base chip 102. Additionally, the Z-interface 232 can provide a pass-through interface through the base chip 102.

The various subsystems and circuits of the base IC on the base chip 102 can be communicatively coupled. As illustrated, the processing system 202, input/output circuits 204, and IP core circuits 206 are communicatively coupled to the NoC 210 (e.g., to the programmable network 212), and hence, are communicatively coupled to each other. The processing system 202 is further communicatively coupled to the NPI 214 for communicating configuration data to various programmable components on the base chip 102. The processing system 202 is further communicatively coupled to the programmable network 212 of the NoC 210 for communicating configuration data to chips overlying the base chip 102. The programmable network 212 of the NoC 210 is communicatively coupled to the Z-interface 232 such that data, such as transactional data and configuration data, can be communicated through the Z-interface 232 to another chip. Each of the processing system 202, input/output circuits 204, and IP core circuits 206 is communicatively coupled to the Z-interface 232 for communications with, e.g., programmable logic in the PL ICs 224, 226, 228 in overlying fabric chips 104, 106. Other communication mechanisms, such as direct connections, between the various subsystems and circuits may be implemented.

The PL IC 224-228 on each of the fabric chips 104-108 includes one or more programmable logic region. The programmable logic region is logic circuitry that may be programmed to perform specified functions. The programmable logic region can include any number or arrangement of programmable tiles. As an example, the programmable logic region may be implemented as fabric of an FPGA. For example, the programmable logic region can include any number of configurable logic blocks (CLBs), look-up tables (LUTs), digital signal processing blocks (DSPs), random access memory blocks (BRAMs), etc. Each of the programmable tiles (e.g., CLBs, LUTs, DSPs, BRAMs, etc.) can include one or more programmable interconnect elements. The various respective types of programmable tiles can be arranged in rows and/or columns, and the associated programmable interconnect elements can be electrically connected to neighboring programmable logic elements in a same column and row, for example. The programmable interconnect element can form an interconnect network of the programmable logic region. Any logic and connections can be implemented by the programmable logic region by programming or configuring any of the programmable tiles of the programmable logic region.

The Z-interface 234-238 on each of the fabric chips 104-108 can include active circuits, such as buffers to drive signals and/or selection circuits. The Z-interface 234-238 provides an interface, including through metal lines and vias in metallization layers, for the respective PL IC 224-228 to communicate with chips overlying and/or underlying the respective fabric chip 104-108. Additionally, the Z-interface 234-238 can provide a pass-through interface through the respective fabric chip 104-108. Configuration data for the PL ICs 224-228 can be transmitted through passive connections through Z-interfaces 234-238, for example.

Each PL IC 224-228 can also include a configuration interconnect that includes a configuration Frame (CFRAME) driver. The CFRAME driver may be or include control logic to communicate configuration data (such as a bitstream) to configure programmable logic. Each programmable logic region is configurable or programmable by configuration data received via the Z-interface 232, a corresponding Z-interface 234-238 of the respective fabric chip 104-108, and any intervening Z-interface 234, 236. For example, the processing system 202 (e.g., a PMC of the processing system 202) can transmit configuration data via the programmable network 212 of the NoC 210 and the Z-interface 232 to a respective PL IC 224-228. In some examples, a configuration interconnect (e.g., including a CFRAME driver) can direct the configuration data to appropriate programmable tiles and can control configuring such programmable tiles.

Examples of clock tree routing are described below in the context of a programmable clock routing network of the chip stack. As noted previously, aspects of clock tree routing as described herein are applicable to a chip stack that includes and/or consists of chips having ASICs and/or have clock trees that are hardwired and/or non-programmable. In the examples below, the programmable clock routing network includes multiple tiers of an in-chip programmable clock routing network, where each of the fabric chips 104-108 includes a tier of an in-chip programmable clock routing network. Out-of-chip connections are between the tiers to electrically connect the tiers in the programmable clock routing network. As used for convenience herein, "in-chip" generally refers to, with reference to FIG. 1, directionality along an X-direction and/or Y-direction. Additionally, as used for convenience herein, "out-of-chip" generally refers to, with reference to FIG. 1, directionality along a Z-direction.

Figure 3:
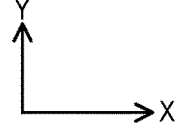
FIG. 3 is a block diagram depicting a fabric chip comprising a programmable logic (PL) integrated circuit (IC) according to some examples.

FIG. 3 is a block diagram depicting a fabric chip 300 comprising a PL IC 302 according to some examples. The fabric chip 300 can represent each of the fabric chips 104-108. The PL IC 302 can represent each PL IC 224-228. The PL IC 302 includes out-of-chip clock routing regions 304 and clock regions 310-11 to 310-44 (collectively or individually, clock region(s) 310). The out-of-chip clock routing regions 304 can represent a portion of each of the Z-interfaces 234-238.

In the example of FIG. 3, PL IC 302 is formed of a two-dimensional array of clock regions 310. Each clock region 310 can correspond to a region of logic circuitry that is programmable to perform specified functions (e.g., a programmable logic region) and can be programmed to provide a clock signal to that logic circuitry. FIG. 3 illustrates, for simplicity, the clock regions 310 arranged in four aligned in-chip columns and four aligned in-chip rows, although other numbers of in-chip columns and/or in-chip rows may be implemented. The reference numerals of the clock regions 310 in FIG. 3 indicate the positioning of each clock region 310 by the reference number "310-[in-chip column][in-chip row]."

Figure 4:
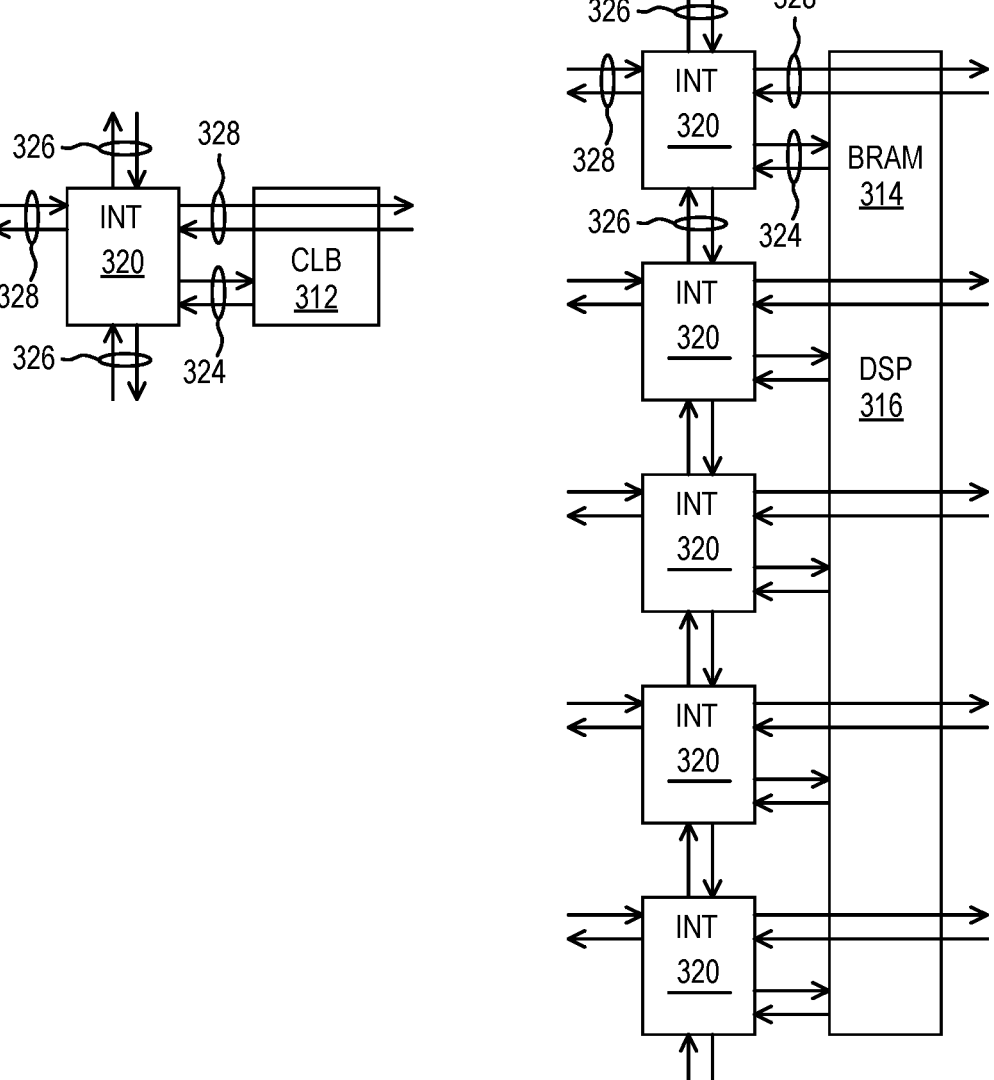
FIG. 4 is a block diagram depicting programmable logic elements and programmable interconnect elements according to some examples.

Example arrangements of programmable logic elements, including CLBs 312, BRAMs 314 and DSPs 316, are illustrated in some of the clock regions 310. The CLBs 312 can further include LUTs. In the illustrated architecture, the PL IC 302 includes in-chip columns of programmable logic elements, where each in-chip column includes a single type of programmable logic element (e.g., an in-chip column of CLBs 312, an in-chip column of BRAMs 314, etc.). As shown in FIG. 4, the programmable logic elements can have one or more associated programmable interconnect elements 320. For example, in some architectures, the PL IC 302 includes an in-chip column of programmable interconnect elements 320 associated with and neighboring each in-chip column of programmable logic elements. In such examples, each programmable interconnect element 320 is electrically connected to an associated programmable logic element in a neighboring in-chip column by interconnections 324 and is electrically connected to neighboring programmable interconnect elements within the same in-chip column by interconnections 326 and is electrically connected to the neighboring in-chip columns by interconnections 328. The interconnected programmable interconnect elements 320 can form a data routing network within the PL IC 302.

The out-of-chip clock routing regions 304 are each disposed extending in an in-chip column direction between a pair of in-chip columns of the clock regions 310. One out-of-chip clock routing region 304 is disposed between an in-chip column of clock regions 310-1$x$ and an in-chip column of clock regions 310-2$x$. Another out-of-chip clock routing region 304 is disposed between an in-chip column of clock regions 310-3$x$ and an in-chip column of clock regions 310-4$x$. As described in detail subsequently, each of the out-of-chip clock routing regions 304 includes connections (e.g., a metal stack including metal lines, metal vias, and TSV(s)) that are configured to route clock signals between chips of the chip stack. Further, each of the out-of-chip clock routing regions 304 includes circuitry configured to route a clock signal from such connections in an in-chip direction within the fabric chip 300.

The numbers of clock regions 310 and out-of-chip clock routing regions 304 are shown merely as an example. Devices implementing concepts described herein can implement any number of clock regions (and further, in any configuration) in the PL IC and any number of out-of-chip clock routing regions in the PL IC.

Figure 5:
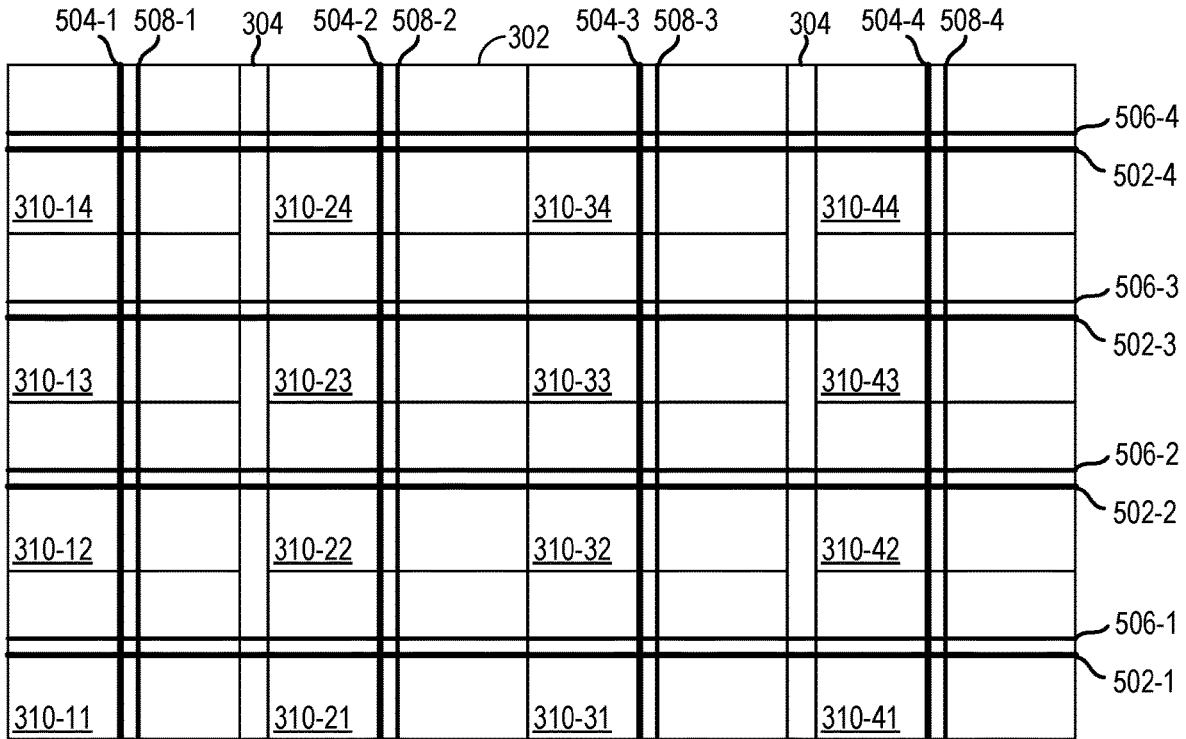
FIG. 5 illustrates aspects of a tier of an in-chip programmable clock routing network in a PL IC according to some examples.

FIG. 5 illustrates aspects of a tier of an in-chip programmable clock routing network in the PL IC 302 according to some examples. The tier includes in-chip horizontal transmission tracks 502-1, 502-2, 502-3, 502-4 (collectively or individually, in-chip horizontal transmission track(s) 502) and in-chip vertical transmission tracks 504-1, 504-2, 504-3, 504-4 (collectively or individually, in-chip vertical transmission track(s) 504). The tier also includes in-chip horizontal distribution tracks 506-1, 506-2, 506-3, 506-4 (collectively or individually, in-chip horizontal distribution track(s) 506) and in-chip vertical distribution tracks 508-1, 508-2, 508-3, 508-4 (collectively or individually, in-chip vertical distribution track(s) 508). The in-chip transmission tracks 502, 504 are configured to route a clock signal for long reaches across the respective fabric chip 104-108 (e.g., across many clock regions 310). The in-chip distribution tracks 506, 508 are configured to route a clock signal for moderate reaches across the respective fabric chip 104-108 (e.g., across one or a few clock regions 310). Each of the in-chip horizontal transmission tracks 502, in-chip vertical transmission tracks 504, in-chip horizontal distribution tracks 506, and in-chip vertical distribution tracks 508 can be or include sixteen individual tracks, or another number of tracks.

Each of the in-chip horizontal transmission tracks 502 extends in-chip horizontally across the PL IC 302 at centers of respective in-chip rows of clock regions 310. In-chip horizontal transmission tracks 502-1 extend across the PL IC 302 at centers of clock regions 310-11, 310-21, 310-31, 310-41. In-chip horizontal transmission tracks 502-2 extend across the PL IC 302 at centers of clock regions 310-12, 310-22, 310-32, 310-42. In-chip horizontal transmission tracks 502-3 extend across the PL IC 302 at centers of clock regions 310-13, 310-23, 310-33, 310-43. In-chip horizontal transmission tracks 502-4 extend across the PL IC 302 at centers of clock regions 310-14, 310-24, 310-34, 310-44.

Each of the in-chip vertical transmission tracks 504 extends in-chip vertically across the PL IC 302 at centers of respective in-chip columns of clock regions 310. In-chip vertical transmission tracks 504-1 extend across the PL IC 302 at centers of clock regions 310-11, 310-12, 310-13, 310-14. In-chip vertical transmission tracks 504-2 extend across the PL IC 302 at centers of clock regions 310-21, 310-22, 310-23, 310-24. In-chip vertical transmission tracks 504-3 extend across the PL IC 302 at centers of clock regions 310-31, 310-32, 310-33, 310-34. In-chip vertical transmission tracks 504-4 extend across the PL IC 302 at centers of clock regions 310-41, 310-42, 310-43, 310-44.

Each of the in-chip horizontal distribution tracks 506 extends in-chip horizontally across the PL IC 302 at centers of respective in-chip rows of clock regions 310. In-chip horizontal distribution tracks 506-1 extend across the PL IC 302 at centers of clock regions 310-11, 310-21, 310-31, 310-41. In-chip horizontal distribution tracks 506-2 extend across the PL IC 302 at centers of clock regions 310-12, 310-22, 310-32, 310-42. In-chip horizontal distribution tracks 506-3 extend across the PL IC 302 at centers of clock regions 310-13, 310-23, 310-33, 310-43. In-chip horizontal distribution tracks 506-4 extend across the PL IC 302 at centers of clock regions 310-14, 310-24, 310-34, 310-44.

Each of the in-chip vertical distribution tracks 508 extends in-chip vertically across the PL IC 302 at centers of respective in-chip columns of clock regions 310. In-chip vertical distribution tracks 508-1 extend across the PL IC 302 at centers of clock regions 310-11, 310-12, 310-13, 310-14. In-chip vertical distribution tracks 508-2 extend across the PL IC 302 at centers of clock regions 310-21, 310-22, 310-23, 310-24. In-chip vertical distribution tracks 508-3 extend across the PL IC 302 at centers of clock regions 310-31, 310-32, 310-33, 310-34. In-chip vertical distribution tracks 508-4 extend across the PL IC 302 at centers of clock regions 310-41, 310-42, 310-43, 310-44.

Additionally, each of the in-chip horizontal transmission tracks 502 and each of the in-chip horizontal distribution tracks 506 traverses the out-of-chip clock routing regions 304. Each of the in-chip horizontal transmission tracks 502 can also be programmably electrically connected to out-of-chip routing (e.g., vertical connections) to receive a clock signal from the base chip 102.

Figure 6:
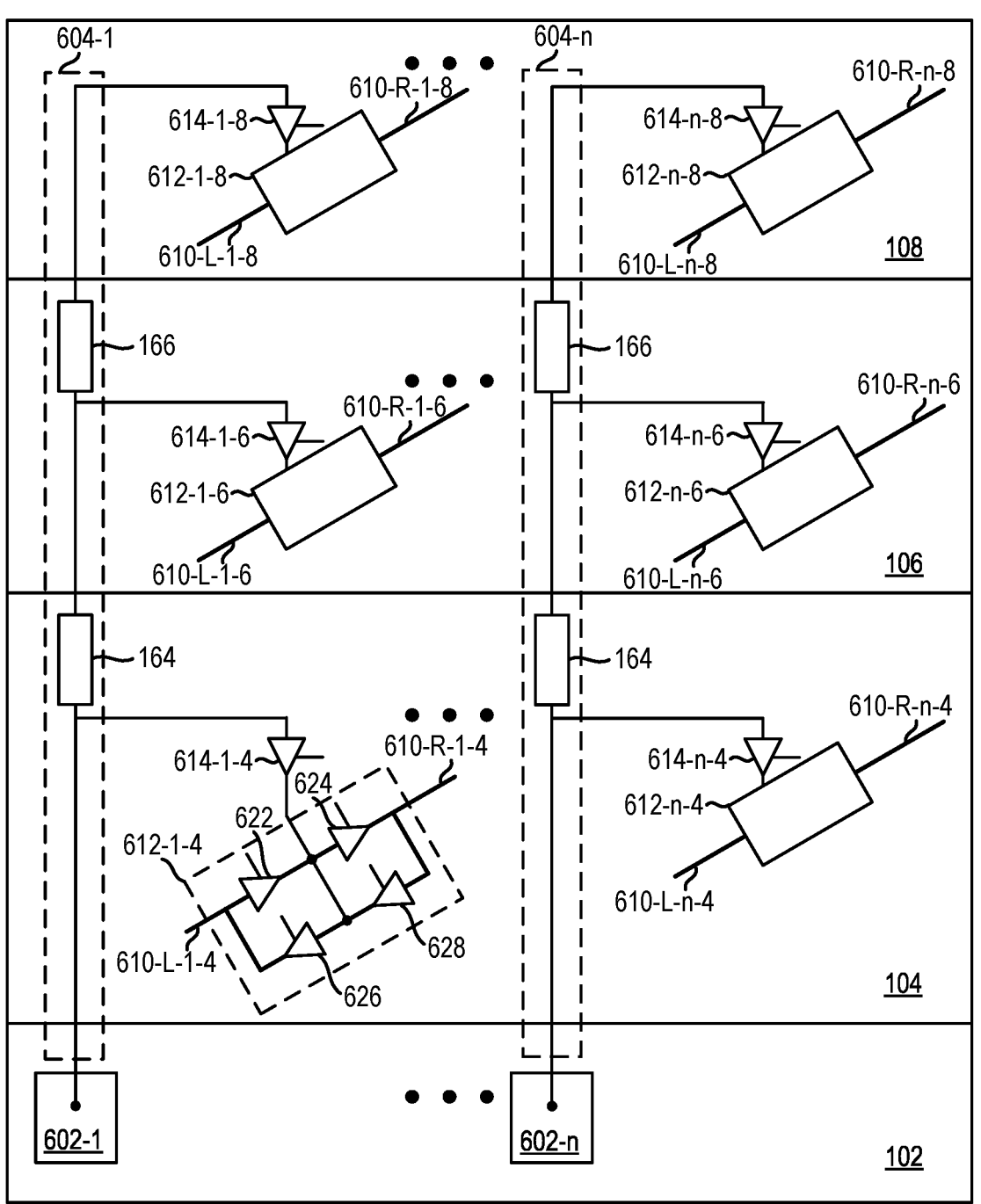
FIG. 6 is a schematic of out-of-chip routing to route clock signals out-of-chip according to some examples.

FIG. 6 is a schematic of out-of-chip routing to route clock signals out-of-chip according to some examples. FIG. 6 shows the base chip 102 and the fabric chips 104-108. The base chip 102 includes clock source circuits 602-1 to 602-n. Portions of respective out-of-chip clock routing regions 304 in the fabric chips 104-108 are also shown.

Metal stacks 604-1 to 604-n extend out-of-chip across the chip stack through the respective out-of-chip clock routing regions 304 in the PL ICs 224-228 in the fabric chips 104-108. In the orientation illustrated in FIG. 1, each metal stack 604 includes, although not specifically shown in FIG. 6, metal line(s) and via(s) in the front side dielectric layer(s) 122, a front side bond pad 152, a front side bond pad 154, metal lines and vias in the front side dielectric layer(s) 124, a backside TSV 164, metal lines and vias in the backside dielectric layer(s) 134, a backside bond pad 174, a front side bond pad 156, metal lines and vias in the front side dielectric layer(s) 126, a backside TSV 166, metal lines and vias in the backside dielectric layer(s) 136, a backside bond pad 176, a front side bond pad 158, and metal lines and vias in the front side dielectric layer(s) 128. Other orientations can have different components and/or order of components. The number of components can further be varied based on the number of chips in the chip stack. The metal lines, vias, TSVs, and bond pads in a given metal stack 604 are generally aligned in an out-of-chip direction.

Each metal stack 604 is electrically connected to a corresponding clock source circuit 602. The corresponding metal stack 604 and clock source circuit 602 may or may not be aligned in the out-of-chip direction. Each clock source circuit 602 can include, for example, a phase-locked loop (PLL) circuit, a driver circuit, or any other circuit to generate and/or drive a clock signal through the corresponding metal stack 604.

Each fabric chip 104-108 includes an individual in-chip transmission track 610 (of the in-chip horizontal transmission tracks 502 or in-chip vertical transmission tracks 504) in the respective fabric chip. Each individual in-chip transmission track 610 within a respective fabric chip 104-108 is configured to be programmably electrically connected to a respective metal stack 604-1 to 604-n. Each individual in-chip transmission track 610 includes a first individual in-chip transmission track segment 610-L and a second individual in-chip transmission track segment 610-R, where, solely for ease of reference, an "L" refers to a left segment in, e.g., a clock region 310 to the left of the out-of-chip clock routing region 304, and an "R" refers to a right segment in, e.g., a clock region 310 to the right of the out-of-chip clock routing region 304. Reference numbers of components illustrated in FIG. 6 are appended with the notation "-i-j", where i indicates a relation with a corresponding clock source circuit 602-i and/or a corresponding metal stack 604-i, and j indicates a corresponding fabric chip 104, 106, 108. The following description is generic to multiple components illustrated in FIG. 6 (e.g., without reference to any appended notation "-i-j"), and a person having ordinary skill in the art will readily understand the applicability of such description to each corresponding component.

Each individual in-chip transmission track 610 includes a bidirectional bridge 612. A buffer 614 is electrically connected between the metal stack 604 and the bidirectional bridge 612. The bidirectional bridge 612 includes buffers 622, 624, 626, 628. The bidirectional bridge 612 programmably electrically connects together and/or decouples the first individual in-chip transmission track segment 610-L and the second individual in-chip transmission track segment 610-R. The buffer 614 programmably electrically connects the bidirectional bridge 612 to the metal stack 604.

An input node of the buffer 614 is electrically connected to the metal stack 604, and an output node of the buffer 614 is electrically connected to a bridge node of the bidirectional bridge 612. The bridge node of the bidirectional bridge 612 is electrically connected to an output node of the buffer 622, an input node of the buffer 624, an input node of the buffer 626, and an output node of the buffer 628. An input node of the buffer 622 and an output node of the buffer 626 are electrically connected to the first individual in-chip transmission track segment 610-L. An output node of the buffer 624 and an input node of the buffer 628 are electrically connected to the second individual in-chip transmission track segment 610-R.

Each buffer 614, 622, 624, 626, 628 may be or include a tri-state buffer Respective control signals of the buffers 614, 622, 624, 626, 628 can be stored in configuration memory (e.g., configuration random access memory (CRAM)) in the PL IC 302, which can be programmed during programming the PL IC 302. By programming various ones of the buffers 614, 622, 624, 626, 628, clock signals can be routed and distributed from a clock source to various loads in the PL IC 302 and to various loads in other chips.

As some examples, each of the buffers 614, 622, 624, 626, 628 can be programmed in a high impedance output state or a pass-through state. In a high impedance output state, the output node of the respective buffer is at a high impedance, which effectively decouples the input node from the output node of the buffer. In a pass-through state, a signal received an input node of the buffer is propagated through to the output node of the buffer. The buffer 614 can be programmed in a high impedance output state to decouple the metal stack 604 from the bidirectional bridge 612. With the metal stack 604 decoupled from the bidirectional bridge 612, a clock signal can be propagated from the first individual in-chip transmission track segment 610-L to the second individual in-chip transmission track segment 610-R by programming the buffers 622, 624 to be in a pass-through state while the buffers 626, 628 are programmed in a high impedance output state, and a clock signal can be propagated from the second individual in-chip transmission track segment 610-R to the first individual in-chip transmission track segment 610-L by programming the buffers 626, 628 to be in a pass-through state while the buffers 622, 624 are programmed in a high impedance output state. The first individual in-chip transmission track segment 610-L to the second individual in-chip transmission track segment 610-R can be decoupled from each other by programming the buffers 622-628 to be in a high impedance output state. A clock signal can be routed from the metal stack 604 to the first individual in-chip transmission track segment 610-L by programming the buffers 614, 626 to be in a pass-through state and the buffer 622 to be in a high impedance output state, and from the metal stack 604 to the second individual in-chip transmission track segment 610-R by programming the buffers 614, 624 to be in a pass-through state and the buffer 628 to be in a high impedance output state. Other combinations of programming the buffers can be implemented to route a clock signal.

Figure 7:
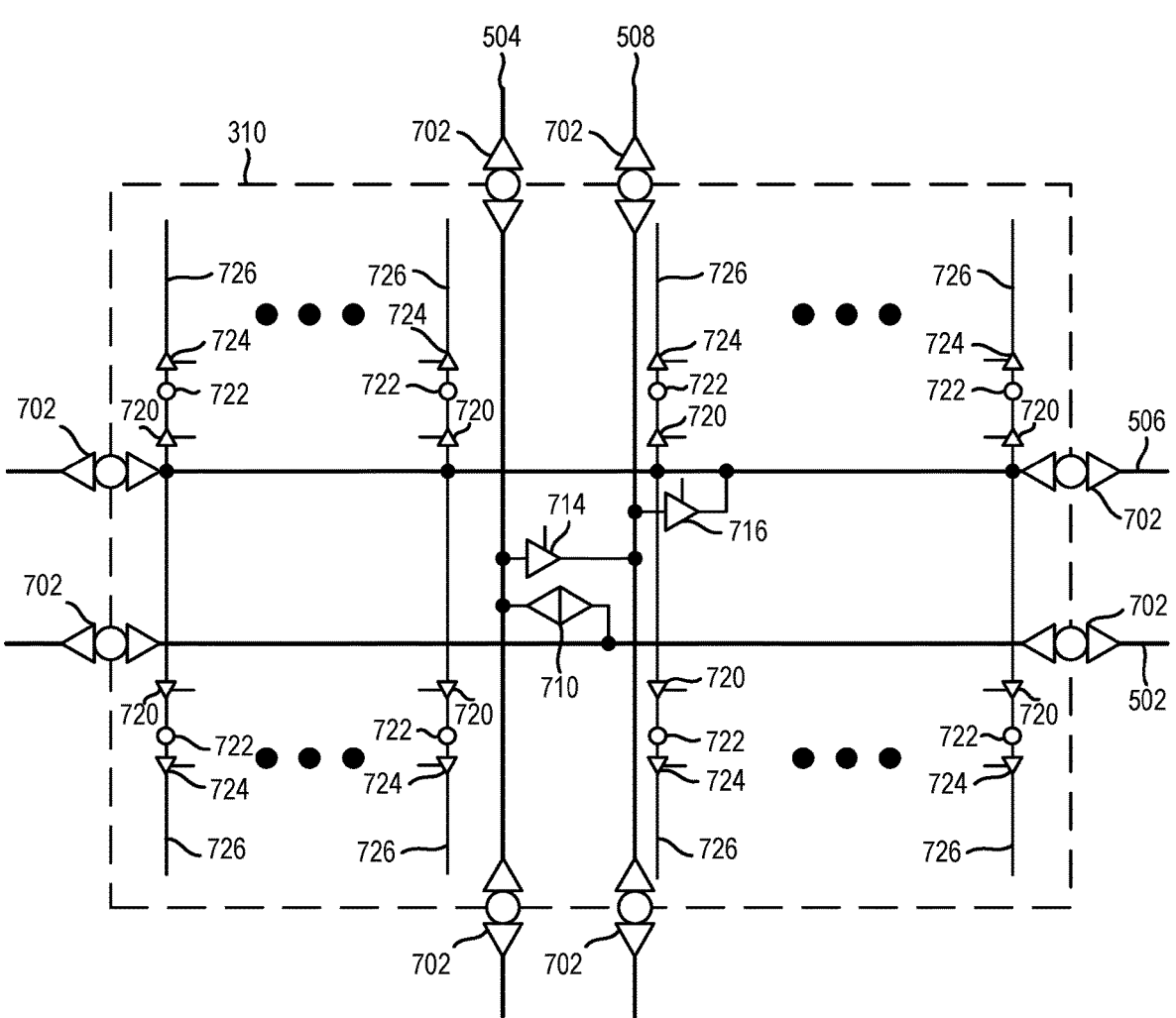
FIG. 7 illustrates aspects of a tier of an in-chip programmable clock routing network in a clock region according to some examples.

FIG. 7 illustrates aspects of a tier of an in-chip programmable clock routing network in a clock region 310 according to some examples. Out-of-chip routing bridges 702 are at a boundary of the clock region 310 and electrically connect the in-chip horizontal transmission tracks 502 across neighboring clock regions 310. Out-of-chip routing bridges 702 are at a boundary of the clock region 310 and electrically connect the in-chip vertical transmission tracks 504 across neighboring clock regions 310. Out-of-chip routing bridges 702 are at a boundary of the clock region 310 and electrically connect the in-chip horizontal distribution tracks 506 across neighboring clock regions 310. Out-of-chip routing bridges 702 are at a boundary of the clock region 310 and electrically connect the in-chip vertical distribution tracks 508 across neighboring clock regions 310. The out-of-chip routing bridges 702 can programmably electrically connect or decouple respective segments of in-chip transmission tracks 502, 504 and in-chip distribution tracks 506, 508 within the clock region 310 of the respective chip to or from segments of in-chip transmission tracks 502, 504 and in-chip distribution tracks 506, 508 within another clock region 310 of the respective chip, an overlying chip, and/or an underlying chip. In some examples, any of the out-of-chip routing bridges 702 in FIG. 7 can be replaced with a bidirectional buffer that can electrically connect or decouple respective segments of in-chip transmission tracks 502, 504 and in-chip distribution tracks 506, 508 within the clock region 310 of the respective chip to or from segments of in-chip transmission tracks 502, 504 and in-chip distribution tracks 506, 508 within another clock region 310 of the respective chip. The presence of the out-of-chip routing bridges 702 can be optional based on an architecture of the chip stack, such as if defect tolerances is implemented in the chip stack to bypass a defect and, if implemented, how the defect tolerance is implemented.

An example out-of-chip routing bridge 702 is described subsequently. In some examples, such as where the boundary adjoins an out-of-chip clock routing region 304, the out-of-chip routing of FIG. 6 may be implemented in the place of or in addition to the out-of-chip routing bridge 702. Further, the out-of-chip routing bridges 702 can be placed differently in other examples. In some examples, an out-of-chip routing bridge 702 may be placed along, e.g., a same in-chip horizontal transmission track 502 at a border of a clock region 310 with some number of clock regions 310 being disposed between neighboring out-of-chip routing bridges 702. When an out-of-chip routing bridge 702 is not placed along an in-chip transmission track 502, 504 or in-chip distribution track 506, 508 at a border of a clock region 310, a bidirectional buffer may be placed at that border of that clock region 310 for the in-chip transmission track 502, 504 or in-chip distribution track 506, 508.

A bidirectional buffer 710 is electrically connected between the in-chip horizontal transmission track 502 and the in-chip vertical transmission track 504. A unidirectional interconnect buffer 714 has an input node electrically connected to the in-chip vertical transmission track 504 and an output node electrically connected to the in-chip vertical distribution track 508. A unidirectional interconnect buffer 716 has an input node electrically connected to the in-chip vertical distribution track 508 and an output node electrically connected to the in-chip horizontal distribution track 506.

Input nodes of first leaf clock buffers 720 are electrically connected to the in-chip horizontal distribution track 506, and respective output nodes of the first leaf clock buffers 720 are electrically connected to respective out-of-chip leaf-level connection nodes 722. Each out-of-chip leaf-level connection node 722 forms an electrical connection at the leaf level between leaf nodes that generally align in the out-of-chip direction in other chips. An example of an out-of-chip leaf-level connection node 722 is described subsequently. The respective out-of-chip leaf-level connection nodes 722 are electrically connected to respective input nodes of second leaf clock buffers 724, and respective output nodes of the second leaf clock buffers 724 are electrically connected to leaf clock tracks 726 that extend along respective in-chip columns in the clock region 310 to programmable logic elements (e.g., loads) within the clock region 310. The leaf clock tracks 726 are respective load nodes (e.g., to which the circuit elements that consume the respective clock signals are, e.g., directly electrically connected).

Each out-of-chip routing bridge 702 may include one or more tri-state buffers and one or more multiplexers, as described below. Each buffer 710, 714, 716, 720, 724 may be or include a tri-state buffer. In some examples, any and/or each leaf clock buffer 720, 724 can be any other selective transmitting circuit, such as a multiplexer. Respective control signals of the out-of-chip routing bridges 702 and buffers 710, 714, 716, 720, 724 (or other selective transmitting circuit) can be stored in configuration memory (e.g., CRAM) in the PL IC 302, which can be programmed during programming the PL IC 302. By programming various ones of the out-of-chip routing bridges 702 and buffers 710, 714, 716, 720, 724, clock signals can be routed and distributed from a clock source to various loads in the PL IC 302 and to various loads in other chips. A person having ordinary skill in the art will readily understand how the various buffers can be programmed to route a clock signal, particularly in view of examples provided above with respect to FIG. 6.

Figure 8:
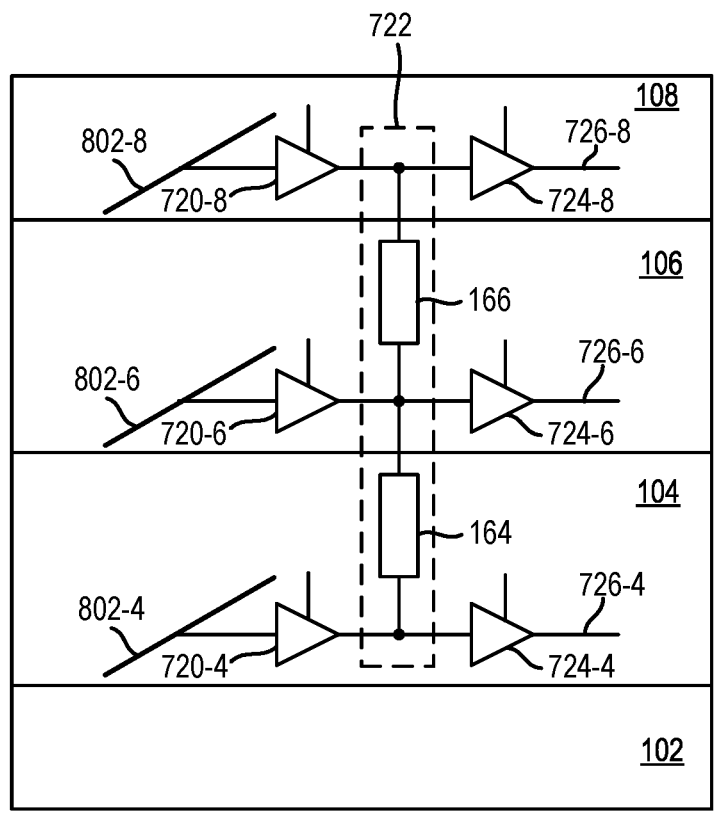
FIG. 8 shows a schematic of a leaf-level connection bridge electrically connected to a programmable clock routing network in a chip stack according to some examples.

FIG. 8 shows a schematic of a leaf-level connection bridge electrically connected to the programmable clock routing network in the chip stack according to some examples. A portion of a respective clock region 310 is illustrated in each fabric chip 104-108. FIG. 8 follows the nomenclature from above where a reference number is appended with a "-4", "-6", or "-8" corresponding to the fabric chip 104, 106, 108, respectively. Each portion of a clock region 310 is shown with an individual in-chip horizontal distribution track segment 802 of the in-chip horizontal distribution tracks 506 of that clock region 310, which forms part of the programmable clock routing network. Like described with respect to FIG. 7, an input node of a first leaf clock buffer 720 is electrically connected to the individual in-chip horizontal distribution track segment 802, and an output node of the first leaf clock buffer 720 is electrically connected to an out-of-chip leaf-level connection node 722. The out-of-chip leaf-level connection node 722 is electrically connected to an input node of a second leaf clock buffer 724, and an output node of the second leaf clock buffer 724 is electrically connected to a leaf clock track 726. As stated above, any and/or each leaf clock buffer 720, 724 can be any other selective transmitting circuit, such as a multiplexer.

In the context of the example orientation of FIG. 1, the out-of-chip leaf-level connection node 722 includes, although not specifically shown in FIG. 8, metal lines and vias in the front side dielectric layer(s) 124, a backside TSV 164, metal lines and vias in the backside dielectric layer(s) 134, a backside bond pad 174, a front side bond pad 156, metal lines and vias in the front side dielectric layer(s) 126, a backside TSV 166, metal lines and vias in the backside dielectric layer(s) 136, a backside bond pad 176, a front side bond pad 158, and metal lines and vias in the front side dielectric layer(s) 128. Other orientations can have different components and/or order of components. The number of components can further be varied based on the number of chips in the chip stack. The metal lines, vias, TSVs, and bond pads in a given out-of-chip leaf-level connection node 722 are generally aligned in an out-of-chip direction.

The out-of-chip leaf-level connection node 722 forms a common bridge node between (i) output nodes of the first leaf clock buffers 720-4, 720-6, 720-8 and (ii) input nodes of the second leaf clock buffers 724-4, 724-6, 724-8. When a clock signal is routed to a given individual in-chip horizontal distribution track segment 802, the corresponding first leaf clock buffer 720 can be programmed to be in a state where that first leaf clock buffer 720 passes the clock signal to the out-of-chip leaf-level connection node 722. The other first leaf clock buffers 720 having output nodes electrically connected to the out-of-chip leaf-level connection node 722 can be programmed to be in a high impedance output state to decouple the corresponding individual in-chip horizontal distribution track segments 802 electrically connected to the input nodes of those first leaf clock buffers 720 from the out-of-chip leaf-level connection node 722. The second leaf clock buffers 724 can then be programmed to pass the clock signal from the out-of-chip leaf-level connection node 722 to corresponding leaf clock tracks 726 or to have a high impedance output state to decouple the corresponding leaf clock tracks 726 from the out-of-chip leaf-level connection node 722.

In the illustrated example, the out-of-chip leaf-level connection node 722 forms a common node. In other examples, an out-of-chip leaf-level connection bridge can include circuitry to selectively electrically couple and decouple the output nodes of the first leaf clock buffers 720 to various ones of the input nodes of the second leaf clock buffers 724. For example, a bidirectional buffer can be electrically connected between (i) the node formed by the electrical connection between the output node of the first leaf clock buffer 720-4 and the input node of the second leaf clock buffer 724-4, and (ii) the node formed by the electrical connection between the output node of the first leaf clock buffer 720-6 and the input node of the second leaf clock buffer 724-6; a bidirectional buffer can be electrically connected between (i) the node formed by the electrical connection between the output node of the first leaf clock buffer 720-6 and the input node of the second leaf clock buffer 724-6, and (ii) the node formed by the electrical connection between the output node of the first leaf clock buffer 720-8 and the input node of the second leaf clock buffer 724-8; and a bidirectional buffer can be electrically connected between (i) the node formed by the electrical connection between the output node of the first leaf clock buffer 720-4 and the input node of the second leaf clock buffer 724-4, and (ii) the node formed by the electrical connection between the output node of the first leaf clock buffer 720-8 and the input node of the second leaf clock buffer 724-8. In such examples, the bidirectional buffer(s) can be programmable, such that respective control signals of the bidirectional buffer(s) can be stored in configuration memory (e.g., CRAM) in the PL IC 302, which can be programmed during programming the PL IC 302. Other circuitry can be implemented.

Figure 9:
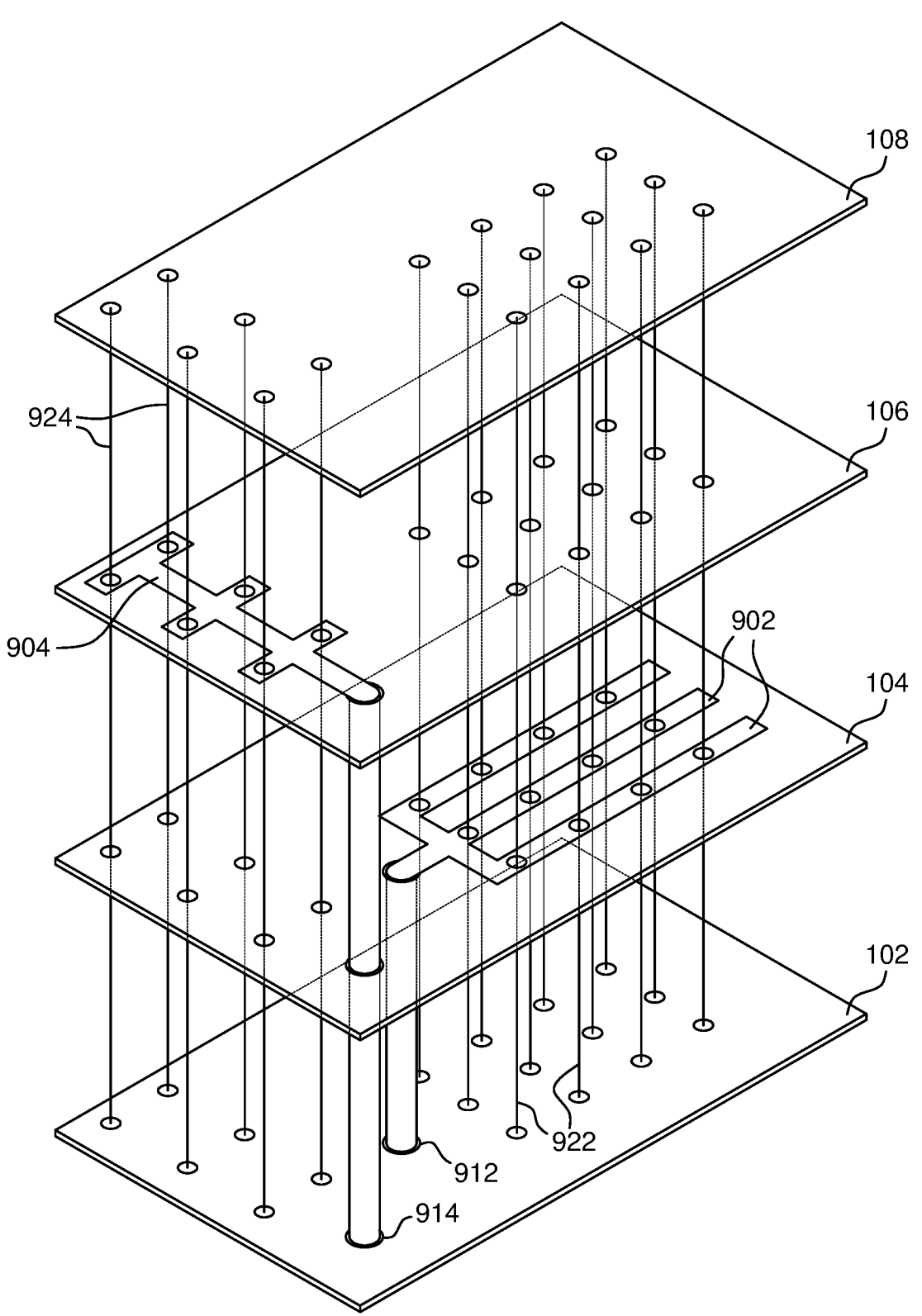
FIG. 9 depicts clock trees in a chip stack according to some examples.

FIG. 9 illustrates, conceptually, clock trees 902, 904 in a chip stack according to some examples. The clock trees 902, 904 are described in the context of the PL ICs described above; however, concepts described with respect to the clock trees 902, 904 are applicable to, e.g., non-programmable ASICs and/or a combination of programmable and non-programmable ASICs, where the clock trees 902, 904 may be routes that are hardwired and non-programmable in the chip stack or where the clock trees 902, 904 may in part be programmable and in other parts be hardwired and non-programmable in the chip stack. Components that are programmed to implement the aspects described herein can be hardwired and non-programmable to likewise implement those aspects.

Generally, in-chip routing of a clock tree to leaf level(s) that operate on a same clock signal provided by the clock tree is contained (e.g., wholly contained) within one logical chip. In some instances, one logical chip is one physical chip. In some instances, e.g., where a portion of a physical chip is defective, one logical chip can include portions of two or more physical chips. For example, in-chip routing of a clock tree to leaf level(s) is contained within one logical chip when, from a branching point (if any) of the clock tree, all of the branches of the clock tree have corresponding in-chip routing within a same physical chip to out-of-chip routing (if any) that are at respective generally same in-chip locations within that physical chip, and from that out-of-chip routing, corresponding in-chip routing of all of the branches is within another same physical chip, which out-of-chip routing can occur any number of times at respective in-chip locations with subsequent corresponding in-chip routing of all of the branches being within a same physical chip until the leaf level(s) are reached.

The base chip 102 includes clock source circuits 912, 914. The clock source circuit 912 is configured to generate a clock signal to be routed by the clock tree 902, and the clock source circuit 914 is configured to generate a clock signal to be routed by the clock tree 904. From the clock source circuit 912, the clock tree 902 includes out-of-chip routing from the base chip 102 to the fabric chip 104. In the context of FIG. 6, this can be implemented by the clock source circuit 912 having an output node electrically connected to a metal stack 604. A buffer 614-4 on the fabric chip 104 that has an input node electrically connected to the metal stack 604 can be programmed to a pass-through state, while other buffers 614 that have respective input nodes electrically connected to the metal stack 604 are programmed to a high impedance output state.

The clock tree 902 is then in-chip routed wholly within the fabric chip 104. The clock tree 902 includes multiple (e.g., three) branches in the in-chip routing. In the context of FIGS. 5-7, the in-chip routing of the clock tree 902 can be implemented by in-chip horizontal transmission tracks 502 (e.g., including an appropriate individual in-chip transmission track 610-4) and in-chip vertical transmission tracks 504, e.g., for long reaches across the fabric chip 104 (e.g., across many clock regions 310). Turns, intersections, branching, etc., of or between the in-chip horizontal transmission tracks 502 and in-chip vertical transmission tracks 504 can be implemented using appropriate bidirectional buffers 710 in respective clock regions 310. The in-chip routing can further be implemented by in-chip horizontal distribution tracks 506 and in-chip vertical distribution tracks 508, e.g., for moderate reaches across the fabric chip 104 (e.g., across one or a few clock regions 310). The in-chip horizontal distribution tracks 506 and in-chip vertical distribution tracks 508 can be electrically connected to appropriate ones of the in-chip horizontal transmission tracks 502 and in-chip vertical transmission tracks 504, and various turns and intersections can be implemented, by buffers 714, 716 at appropriate clock regions 310. At a respective clock region 310 that includes the leaf nodes of the fabric chip 104 that operate using or consume the clock signal of the clock tree 902, the clock tree 902 includes an appropriate in-chip horizontal distribution track 506 (e.g., individual in-chip horizontal distribution track segment 802).

After the in-chip routing, the clock tree 902 reaches the leaf level. The leaf level can include tracks (e.g., short reach tracks) in a clock region 310 that are directly electrically connected to respective one or more leaf nodes in the clock region 310 that consume or operate on the clock signal provided via the clock tree 902. Out-of-chip leaf-level connection bridges 922 are connected to the clock tree 902 at the leaf level. In the context of FIGS. 7 and 8, the individual in-chip horizontal distribution track segment 802-4 within a respective clock region 310 on the fabric chip 104 is the concluding branch of the in-chip routing of the clock tree 902. For each out-of-chip leaf-level connection bridge 922 (e.g., as shown in FIG. 8), the corresponding first leaf clock buffer 720-4 in the fabric chip 104 having an input node electrically connected to the individual in-chip horizontal distribution track segment 802-4 is programmed to be in a pass-through state, and the other buffers 720 having respective output nodes electrically connected to the out-of-chip leaf-level connection node 722 are programmed to be in a high impedance output state to decouple the out-of-chip leaf-level connection node 722 from individual in-chip horizontal distribution track segments 802 in other chips. Appropriate ones of the buffers 724 in any chip 102-108 are then programmed in a pass-through state or high impedance output state to electrically connect or decouple the out-of-chip leaf-level connection node 722 to corresponding leaf clock tracks 726. The leaf clock tracks 726 are directly electrically connected to the leaf nodes, (e.g., without further branching of the tracks).

The clock tree 904 is like the clock tree 902 except the in-chip routing is within the fabric chip 106. From the clock source circuit 914, the clock tree 904 includes out-of-chip routing from the base chip 102 to the fabric chip 106. The clock tree 904 is then in-chip routed wholly within the fabric chip 106 and includes multiple branches in the in-chip routing. After the in-chip routing, the clock tree 904 reaches the leaf level. Out-of-chip leaf-level connection bridges 924 are connected to the clock tree 904 at the leaf level.

According to some examples, having in-chip routing contained within one logical chip can reduce skew of a clock signal received at leaf nodes on different chips. In semiconductor processing, process variation can result in a variation within a wafer (e.g., intra-wafer variation) and a variation from wafer-to-wafer (e.g., inter-wafer variation). While inter-wafer variation may occur between wafers of a same lot, inter-wafer variation may be greater between wafers of different lots. As highlighted below, the chips 102-108 can be fabricated on different wafers, which can result in inter-wafer variation between the chips 102-108. If a clock tree includes in-chip routing in parallel in different chips, the inter-wafer variation can cause skew between the clock signal received at a leaf node on one chip and the clock signal received at a leaf node on a different chip. According to some examples, with in-chip routing being within one logical chip, the clock signal received at leaf nodes on different chips can be propagated largely on a same path such that skew of the clock signal relative to what was generated by the clock source circuit is a common mode skew to those leaf nodes, and any skew between the clock signal at different leaf nodes can result from relatively short reaches by out-of-chip leaf-level connection bridges and leaf clock tracks. These relatively short reaches can reduce the skew between the clock signal received at the different leaf nodes since the difference in paths, and resulting variation (e.g., due to inter-wafer variation), to the different leaf nodes can be relatively small. Even when a clock tree has multiple branches in the in-chip routing within a logical chip, the skew between clock signals received from the different branches can be relatively small due to intra-wafer variation within that logical chip generally being relatively small (e.g., in relation to inter-wafer variation). Implementing such in-chip routing for a clock tree can reduce hold violations, and can increase performance by increasing timing margins.

Figure 10:
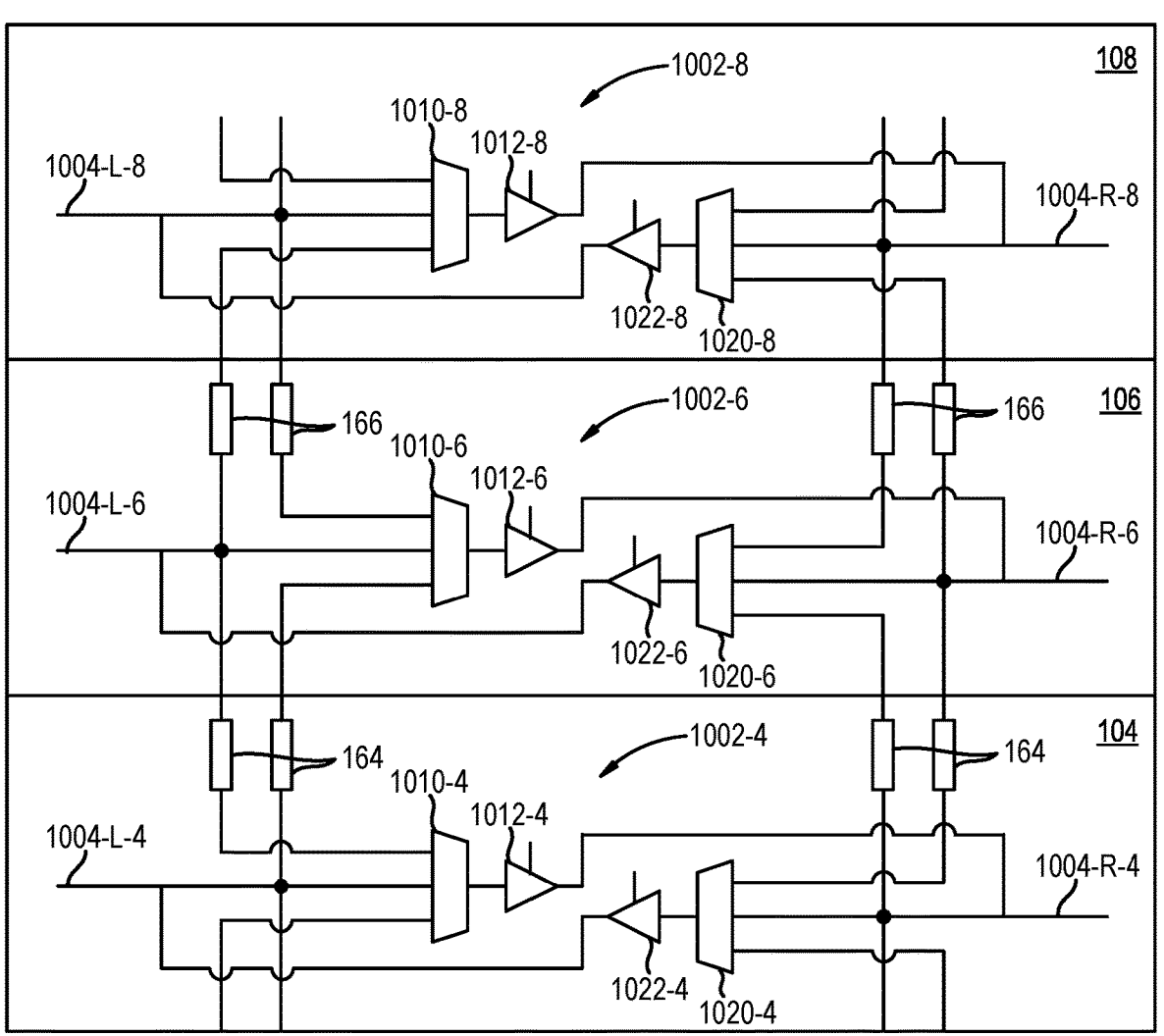
FIG. 10 is a schematic of out-of-chip routing bridges in a chip stack according to some examples.

FIG. 10 is a schematic of out-of-chip routing bridges 1002-4, 1002-6, 1002-8 in a chip stack according to some examples. FIG. 10 follows the nomenclature from above where a reference number is appended with a "-4", "-6", or "-8" corresponding to the fabric chip 104, 106, 108, respectively. Each out-of-chip routing bridge 1002 is an individual instance of an out-of-chip routing bridge 702 in FIG. 7 at a respective boundary between clock regions 310 in a respective chip. Each out-of-chip routing bridge 1002 is electrically connected between an individual in-chip horizontal transmission track segment 1004-L of in-chip horizontal transmission tracks 502, in-chip vertical transmission tracks 504, in-chip horizontal distribution tracks 506, or in-chip vertical distribution tracks 508 in, e.g., a left clock region 310 and an individual in-chip horizontal transmission track segment 1004-R of in-chip horizontal transmission tracks 502, in-chip vertical transmission tracks 504, in-chip horizontal distribution tracks 506, or in-chip vertical distribution tracks 508 in, e.g., a right clock region 310. Each out-of-chip routing bridge 1002 includes multiplexers 1010, 1020 and buffers 1012, 1022.

A first input node of the multiplexer 1010 is electrically connected to a corresponding individual in-chip horizontal transmission track segment 1004-L within the respective chip. A second input node of the multiplexer 1010 is electrically connected to an individual in-chip horizontal transmission track segment 1004-L in a chip underlying the respective chip (if any). A third input node of the multiplexer 1010 is electrically connected to an individual in-chip horizontal transmission track segment 1004-L in a chip overlying the respective chip (if any). An output node of the multiplexer 1010 is electrically connected to an input node of the buffer 1012. An output node of the buffer 1012 is electrically connected to a corresponding individual in-chip horizontal transmission track segment 1004-R within the respective chip.

A first input node of the multiplexer 1020 is electrically connected to a corresponding individual in-chip horizontal transmission track segment 1004-R within the respective chip. A second input node of the multiplexer 1020 is electrically connected to an individual in-chip horizontal transmission track segment 1004-R in a chip underlying the respective chip (if any). A third input node of the multiplexer 1020 is electrically connected to an individual in-chip horizontal transmission track segment 1004-R in a chip overlying the respective chip (if any). An output node of the multiplexer 1020 is electrically connected to an input node of the buffer 1022. An output node of the buffer 1022 is electrically connected to a corresponding individual in-chip horizontal transmission track segment 1004-L within the respective chip.

In the context of the example orientation of FIG. 1, a connection between an input node of a multiplexer 1010, 1020 of a respective chip and an individual in-chip horizontal transmission track segment 1004-L, 1004-R in a chip overlying the respective chip can include metal lines and vias in the front side dielectric layer(s) 124, 126 of the respective chip, a backside TSV 164, 166 of the respective chip, metal lines and vias in the backside dielectric layer(s) 134, 136 of the respective chip, a backside bond pad 174, 176 of the respective chip, a front side bond pad 156, 158 of the overlying chip, and metal lines and vias in the front side dielectric layer(s) 126, 128 of the overlying chip. In the context of the example orientation of FIG. 1, a connection between an input node of a multiplexer 1010, 1020 of a respective chip and an individual in-chip horizontal transmission track segment 1004-L, 1004-R in a chip underlying the respective chip can include metal lines and vias in the front side dielectric layer(s) 126, 128 of the respective chip, a front side bond pad 156, 158 of the respective chip, a backside bond pad 174, 176 of the underlying chip, metal lines and vias in the backside dielectric layer(s) 134, 136 of the underlying chip, a backside TSV 164, 166 of the respective chip, and metal lines and vias in the front side dielectric layer(s) 124, 126 of the underlying chip. Other orientations can have different components and/or order of components. The number of components can further be varied based on the number of chips in the chip stack.

The out-of-chip routing bridges 1002 permit bypassing defective clock regions by routing a clock signal to an underlying or overlying chip. Assuming no defects, clock signals can be routed based on a configuration generated from a user design. Under such a scenario, each multiplexer 1010 can be programmed to output a signal from the input node electrically connected to the individual in-chip horizontal transmission track segment 1004-L disposed on the same chip of the respective multiplexer 1010, and each multiplexer 1020 can be programmed to output a signal from the input node electrically connected to the individual in-chip horizontal transmission track segment 1004-R disposed on the same chip of the respective multiplexer 1020. The buffers 1012, 1022 can be programmed based on the directionality of the signal to be routed according to the user design. If a clock signal is to be routed from the individual in-chip horizontal transmission track segment 1004-L to the individual in-chip horizontal transmission track segment 1004-R (e.g., from left to right in the illustration) in the same chip, the buffer 1012 can be programmed in a pass-through state to pass the clock signal, while the buffer 1022 can be programmed to have a high impedance output state. Similarly, if a clock signal is to be routed from the individual in-chip horizontal transmission track segment 1004-R to the individual in-chip horizontal transmission track segment 1004-L (e.g., from right to left in the illustration) in the same chip, the buffer 1022 can be programmed in a pass-through state to pass the clock signal, while the buffer 1012 can be programmed to have a high impedance output state.

When a defect is present, the defect can be bypassed by programming various ones of the multiplexers 1010, 1020 and buffers 1012, 1022. For example, assume a clock signal is routed on individual in-chip horizontal transmission track segment 1004-L-6 (e.g., from left to right in the illustration) in the fabric chip 106, and that individual in-chip horizontal transmission track segment 1004-R-6 is defective (e.g., in the metal line(s) of the individual in-chip horizontal transmission track segment 1004-R-6 or some component electrically connected to the metal line(s) of the individual in-chip horizontal transmission track segment 1004-R-6). Both of the buffers 1012-6, 1022-6 are programmed to be in high impedance output states. The buffer 1012-6 is programmed to be in the high impedance output state due to the defect of the individual in-chip horizontal transmission track segment 1004-R-6. The buffer 1022-6 is programmed to be in the high impedance output state due to a user design routing the clock signal on the individual in-chip horizontal transmission track segment 1004-L-6, e.g., from left to right. With the buffers 1012-6, 1022-6 programmed to be in high impedance output states, the multiplexers 1010-6, 1020-6 can be programmed in any state (e.g., "do not care" state). The multiplexer 1010-8 can be programmed to output the clock signal from the input node that is electrically connected to the individual in-chip horizontal transmission track segment 1004-L-6, and the buffer 1012-8 can be programmed in a pass-through state to output the clock signal that is output from the multiplexer 1010-8 to the individual in-chip horizontal transmission track segment 1004-R-8. The clock signal can then be routed along the individual in-chip horizontal transmission track segment 1004-R-8 in the fabric chip 108. A number of other combinations can be implemented for routing clock signals as a person having ordinary skill in the art will readily understand upon viewing FIG. 10.

Each multiplexer 1010, 1020 can have control signals for controlling which input node is selected for outputting a signal from the selected input node, and the control signals can be stored in memory. In some examples, the memory for the control signals of the multiplexers 1010, 1020 is non-volatile, one-time programmable memory, such as electric fuses (eFuses). Programming the memory for the multiplexers 1010, 1020 can be performed after fabrication of the chip stack and testing of the stacked chips. The testing can identify defects in the chips of the chip stack. Assuming sufficient resources of the chip stack are not defective such that the chip stack can be operational, the memory can be programmed to provide routing between chips to bypass defects.

Each buffer 1012, 1022 may be or include a tri-state buffer. In some examples, any and/or each buffer 1012, 1022 can be any other selective transmitting circuit, such as a multiplexer. A control signal of the respective buffer 1012, 1022 can result from logic (e.g., combinational logic, such as an AND gate, NOR gate, or other logic) that has respective input nodes electrically connected to, e.g., two bits memory. One bit of memory can be non-volatile, one-time programmable memory, such as eFuses, that can be programmed as a result of testing. For example, if the individual in-chip horizontal transmission track segment 1004 that is electrically connected to the output node of the respective buffer 1012, 1022 is defective, the one-bit of (e.g., non-volatile, one-time programmable) memory can be programmed such that the respective buffer 1012, 1022 is in a high impedance output state. Otherwise, the one-bit of memory can be programmed such that another one-bit of memory, such as configuration memory, that is electrically connected to another input node of the logic controls the state of the respective buffer 1012, 1022. The other one-bit of memory can be programmed such that the respective buffer 1012, 1022 is responsively in a pass-through state or a high impedance output state based on a user design. This other one-bit of memory for the respective buffer 1012, 1022 can be programmed during programming the PL IC 302. Table 1 is the logic table for the state of the buffer 1012 (and correspondingly, buffer 1022 in parenthesis) based on whether the individual in-chip horizontal transmission track segment 1004 to which the output node of the buffer 1012 is defective or operational and based on a user design indicating for the buffer 1012 to be in a pass-through state or a high impedance output state. Various logic can implement such a table.

TABLE 1

|  | 1004-R(1004-L) | User Design for 1012(1022) | Output of 1012(1022) |
|---|---|---|---|
| (1) | Defective | X | High Impedance |
| (2) | Operational | Decouple | High Impedance |
| (3) | Operational | Pass-Through | Output of Multiplexer 1010(1020) |

Figure 11:
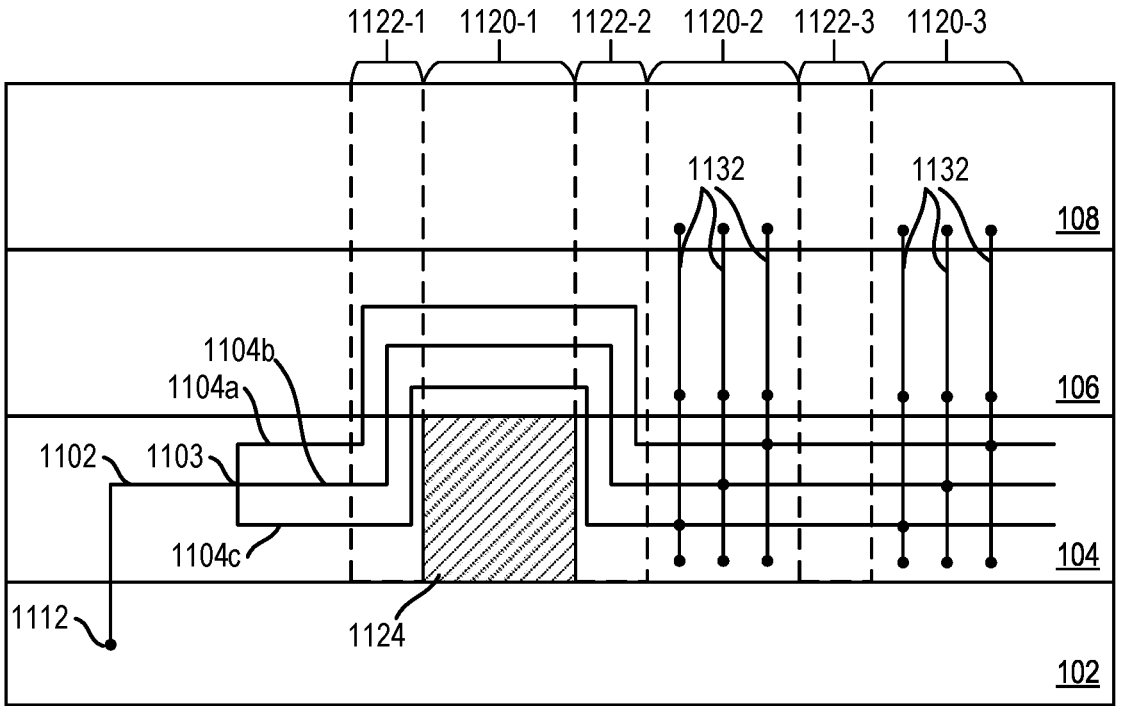
FIG. 11 depicts a clock tree in a chip stack according to some examples.

FIG. 11 illustrates, conceptually, a clock tree 1102 in a chip stack according to some examples. The clock tree 1102 is described in the context of the PL ICs described above; however, concepts described with respect to the clock tree 1102 are applicable to, e.g., non-programmable ASICs and/or a combination of programmable and non-programmable ASICs, where the clock tree 1102 may be routes that are hardwired and non-programmable in the chip stack or where the clock tree 1102 may in part be programmable and in other parts be hardwired and non-programmable in the chip stack. Components that are programmed to implement the aspects described herein can be hardwired and non-programmable to likewise implement those aspects.

As described with respect to FIG. 9, in-chip routing of a clock tree to leaf level(s) that operate on a same clock signal provided by the clock tree is contained (e.g., wholly contained) within one logical chip. FIG. 11 illustrates a clock tree 1102 that is contained within one logical chip, which is two physical chips in the illustrated example. In other instances, one logical chip may be more than two physical chips. As illustrated, in-chip routing of the clock tree 1102 to leaf level(s) is contained within one logical chip because, from a branching point 1103 of the clock tree 1102 in the fabric chip 104, each branch of the clock tree 1102 has corresponding in-chip routing within a same physical chip to out-of-chip routing at respective generally same in-chip locations (e.g., in sliver 1122-1 and in sliver 1122-2) within that physical chip followed by corresponding in-chip routing within another same physical chip until the leaf level(s) at the out-of-chip leaf-level connection bridges 1132 are reached.

FIG. 11 shows the fabric chips 104-108 including slivers 1120-1, 1120-2, 1120-3 (collectively or individually, sliver(s) 1120) of clock regions 310 and slivers 1122-1, 1122-2, 1122-3 (collectively or individually, sliver(s) 1122) of out-of-chip routing bridges 1002. The slivers 1120 and slivers 1122 alternate in the illustrated example. Each fabric chip 104-108 includes one or more clock region 310 in a respective sliver 1120 of clock regions 310. The clock regions 310 of the fabric chips 104-108 within a respective sliver 1120 can be physically and/or logically aligned. Similarly, each fabric chip 104-108 includes an out-of-chip routing bridge 1002 in a respective sliver 1122 of out-of-chip routing bridges 1002. The out-of-chip routing bridges 1002 of the fabric chips 104-108 within a respective sliver 1122 can be physically and/or logically aligned.

The base chip 102 includes a clock source circuit 1112. The clock source circuit 1112 is configured to generate a clock signal to be routed by the clock tree 1102. From the clock source circuit 1112, the clock tree 1102 includes out-of-chip routing from the base chip 102 to the fabric chip 104. In the context of FIG. 6, this can be implemented by the clock source circuit 1112 having an output node electrically connected to a metal stack 604. A buffer 614-4 on the fabric chip 104 that has an input node electrically connected to the metal stack 604 can be programmed to a pass-through state, while other buffers 614 that have respective input nodes electrically connected to the metal stack 604 are programmed to a high impedance output state.

The clock tree 1102 is then in-chip routed wholly within one logical chip, which includes portions of the fabric chips 104, 106. The clock tree 1102 includes multiple (e.g., three) branches 1104a, 1104b, 1104c in the in-chip routing. In the context of FIGS. 5-7, the in-chip routing of the clock tree 1102 can be implemented by in-chip horizontal transmission tracks 502 (e.g., including an appropriate individual in-chip transmission track 610-4) and in-chip vertical transmission tracks 504, e.g., for long reaches across the fabric chips 104, 106 (e.g., across many clock regions 310). Turns, intersections, branching, etc., of or between the in-chip horizontal transmission tracks 502 and in-chip vertical transmission tracks 504 can be implemented using appropriate bidirectional buffers 710 in respective clock regions 310. The in-chip routing can further be implemented by in-chip horizontal distribution tracks 506 and in-chip vertical distribution tracks 508, e.g., for moderate reaches across the fabric chip 104 (e.g., across one or a few clock regions 310). The in-chip horizontal distribution tracks 506 and in-chip vertical distribution tracks 508 can be electrically connected to appropriate ones of the in-chip horizontal transmission tracks 502 and in-chip vertical transmission tracks 504, and various turns and intersections can be implemented, by buffers 714, 716 at appropriate clock regions 310. At a respective clock region 310 that includes the leaf nodes of the fabric chip 104 that operate using or consume the clock signal of the clock tree 1102, the clock tree 1102 includes an appropriate in-chip horizontal distribution track 506 (e.g., individual in-chip horizontal distribution track segment 802).

The clock tree 1102 includes out-of-chip routing between the fabric chips 104, 106. This out-of-chip routing is implemented by out-of-chip routing bridges 1002 in the fabric chips 104, 106 in the sliver 1122-1 and in sliver 1122-2. In the context of sliver 1122-1 and referring to FIG. 10, each branch of the clock tree 1102 includes a corresponding individual in-chip horizontal transmission track segment 1004-L-4, and the corresponding buffers 1012-4, 1022-4, 1022-6 are programmed to be in a high impedance output state. The multiplexer 1010-6 is programmed to pass the signal from the underlying chip (e.g., the fabric chip 104), and the buffer 1012-6 is programmed in a pass-through state. In the context of sliver 1122-2 and referring to FIG. 10, each branch of the clock tree 1102 includes a corresponding individual in-chip horizontal transmission track segment 1004-L-6, and the corresponding buffers 1022-6, 1022-4 are programmed to be in a high impedance output state. The multiplexer 1010-4 is programmed to pass the signal from the overlying chip (e.g., the fabric chip 106), and the buffer 1012-4 is programmed in a pass-through state. Between and after the slivers 1122-1, 1122-2 the clock tree 1102 continues the in-chip routing. After the in-chip routing, the clock tree 1102 reaches the out-of-chip leaf-level connection bridges 1132, which are connected to the clock tree 1102 at the leaf level, like in FIG. 9.

From the branching point 1103 of the clock tree 1102, each branch 1104a, 1104b, 1104c of the clock tree 1102 has corresponding in-chip routing within the fabric chip 104 to out-of-chip routing at the sliver 1122-1 in the fabric chip 104. Each branch 1104a, 1104b, 1104c is routed by out-of-chip routing in the sliver 1122-1 to the fabric chip 106, and then has corresponding in-chip routing within the fabric chip 106 to out-of-chip routing at the sliver 1122-2 in the fabric chip 106. Each branch 1104a, 1104b, 1104c is then routed by out-of-chip routing in the sliver 1122-2 to the fabric chip 104, and thereafter has corresponding in-chip routing within the fabric chip 104 to the leaf levels including the out-of-chip leaf-level connection bridges 1132. This routing is therefore contained within one logical chip. Although out-of-chip routing may be by using different physical structures such that the out-of-chip routing is not an exact same in-chip location for each of the branches 1104a, 1104b, 1104c, each of the corresponding instances of out-of-chip routing for the branches 1104a, 1104b, 1104c occurs in a same sliver (e.g., sliver 1122-1 or sliver 1122-2) such that in-chip locations of out-of-chip routing are generally the same. Further, as an example of routing not being contained within one logical chip, if branch 1104a is routed by out-of-chip routing at sliver 1122-1 to the fabric chip 108 and subsequently routed by in-chip routing in the fabric chip 108 to sliver 1122-2 while the branches 1104b, 1104c are routed as described above and illustrated in FIG. 11, the in-chip routing would not be contained within one logical chip.

Implementing the slivers 1122 of out-of-chip routing bridges 1002 permits the in-chip routing of a clock tree to bypass a region, such as region 1124, that has a defect that would prevent in-chip routing through the region. In some instances, a clock tree can be in-chip routed around a defective region, and the slivers 1122 provide additional flexibility to route the clock tree out-of-chip while maintaining in-chip routing within one logical chip. The clock tree 1102 is shown to have in-chip routing that begins and concludes in the fabric chip 104, and in other examples, the in-chip routing could conclude in another chip and can have out-of-chip routing through more chips. Many permutations of the in-chip routing through many chips (while being contained within one logical chip) can be implemented.

Implementing the routing shown in FIG. 11 can also include using active deskewing of a clock signal on the clock tree. Routing of the clock tree in different physical chips (although one logical chip) can result in the clock signal incurring different intra-wafer variation on the different physical chips, which can cause the clock signal on the clock tree to incur a different skew. An active deskew can accommodate this skew from routing in different physical chips. Distributed phase detectors and delay lines can tune and/or equalize delays between the different clock regions, thus nulling out the process variation component of the clock skew up to the leaf level.

The architecture described herein further permits routing of a clock tree from a clock source (e.g., clock source circuit 1112) in-chip and out-of-chip in any chip of the chip stack. Whether the clock tree is hardwired in an ASIC implementation or programmed in a programmable implementation, a clock signal sourced on, e.g., the base chip 102 can reach any fabric chip 104-108, can be routed on any of the chips 102-108 and still reach all the same loads on any of the chips 102-108. Respective clock networks on fabric chips 104-108 can be used for routing interchangeably since those clock networks are all programmably shorted together at the leaf level.

FIG. 12 is a flowchart of a method 1200 of forming the multi-chip device of FIG. 1 according to some examples. The processing of the method 1200 of FIG. 12 is generally described, and a person having ordinary skill in the art will readily understand the more specific processing that can be performed. The more specific processing can be according to any semiconductor processing for forming an IC on a substrate, which is to be singulated into a chip. For ease of description herein, a wafer on which one or more base chips 102 are formed is referred to as a base wafer, and a wafer on which one or more fabric chips 104, 106, 108 are formed is referred to as a fabric wafer. Any wafer can be any shape and/or size.

At block 1202, front side processing for chips on the respective wafers is performed. For example, front side processing of each semiconductor substrate 112, 114, 116, 118 (e.g., wafer) can include forming devices (e.g., transistors 142, 144, 146, 148) in and/or on the front surface of the semiconductor substrate 112, 114, 116, 118, and forming front side dielectric layer(s) 122, 124, 126, 128 with metallizations and front side bond pads 152, 154, 156, 158 on the front surface of the semiconductor substrate 112, 114, 116, 118. Multiple base chips 102 can be formed on a base wafer. Multiple fabric chips 104, 106, or 108 can be formed on each of a plurality of fabric wafers.

At block 1204, a base wafer is bonded to a first fabric wafer, such as front side to front side bonding as shown in FIG. 1. As a result of the bonding, a front side of a base chip 102 is bonded to a front side of a fabric chip 104, as shown in FIG. 1. The bonding can be hybrid bonding, such as bonding front side bond pads 152 on the base wafer to front side bond pads 154 on the first fabric wafer, and bonding the exterior surface of the front side dielectric layer(s) 122 on the base wafer to the exterior surface of the front side dielectric layer(s) 124 on the first fabric wafer.

At block 1206, the semiconductor substrate of the first fabric wafer is thinned from a backside of the first fabric wafer. As show in FIG. 1, the semiconductor substrate 114 of the fabric chip 104 is thinned from the backside. The thinning can be by a chemical mechanical polish (CMP) or other appropriate process. At block 1208, backside processing for fabric chips on the first fabric wafer is performed. As illustrated by FIG. 1, the backside processing can include forming backside TSVs 164 through the semiconductor substrate 114 of the first fabric wafer and connecting to metallization in the front side dielectric layer(s) 124 on the first fabric wafer. The backside processing can further include forming backside dielectric layer(s) 134 with metallizations and backside bond pads 174 on the backside of the semiconductor substrate 114. The metallizations in the backside dielectric layer(s) 134 can be electrically connected to the metallizations in the front side dielectric layer(s) 124 through the backside TSVs 164.

At block 1210, the first fabric wafer is bonded to a second fabric wafer, such as backside to front side bonding as shown in FIG. 1. As a result of the bonding, a backside of a fabric chip 104 is bonded to a front side of a fabric chip 106, as shown in FIG. 1. The bonding can be hybrid bonding, such as bonding backside bond pads 174 on the first fabric wafer to front side bond pads 156 on the second fabric wafer, and bonding the exterior surface of the backside dielectric layer(s) 134 on the first fabric wafer to the exterior surface of the front side dielectric layer(s) 126 on the second fabric wafer.

At block 1212, the semiconductor substrate of the second fabric wafer is thinned from a backside of the second fabric wafer, like described with respect to block 1206. As show in FIG. 1, the semiconductor substrate 116 of the fabric chip 106 is thinned from the backside.

At block 1214, backside processing for fabric chips on the second fabric wafer is performed, like described with respect to block 1208. As illustrated by FIG. 1, the backside processing can include forming backside TSVs 166 through the semiconductor substrate 116 of the second fabric wafer and connecting to metallization in the front side dielectric layer(s) 126 on the second fabric wafer. The backside processing can further include forming backside dielectric layer(s) 136 with metallizations and backside bond pads 176 on the backside of the semiconductor substrate 116. The metallizations in the backside dielectric layer(s) 136 can be electrically connected to the metallizations in the front side dielectric layer(s) 126 through the backside TSVs 166.

At block 1216, the second fabric wafer is bonded to a third fabric wafer, such as backside to front side bonding as shown in FIG. 1. As a result of the bonding, a backside of a fabric chip 106 is bonded to a front side of a fabric chip 108, as shown in FIG. 1. The bonding can be hybrid bonding, such as bonding backside bond pads 176 on the second fabric wafer to front side bond pads 158 on the third fabric wafer, and bonding the exterior surface of the backside dielectric layer(s) 136 on the second fabric wafer to the exterior surface of the front side dielectric layer(s) 128 on the third fabric wafer.

At block 1218, the semiconductor substrate of the base wafer is thinned from a backside of the base wafer, like described with respect to block 1206. As show in FIG. 1, the semiconductor substrate 112 of the base chip 102 is thinned from the backside.

At block 1220, backside processing for base chips on the base wafer is performed, like described with respect to block 1208. As illustrated by FIG. 1, the backside processing can include forming backside TSVs 162 through the semiconductor substrate 112 of the base wafer and connecting to metallization in the front side dielectric layer(s) 122 on the base wafer. The backside processing can further include forming backside dielectric layer(s) 132 with metallizations and exterior connector backside pads 172 on the backside of the semiconductor substrate 112. The metallizations in the backside dielectric layer(s) 132 can be electrically connected to the metallizations in the front side dielectric layer(s) 122 through the backside TSVs 162. The backside processing for the base chips 102 can further include forming the passivation layer 180 and external connectors 182. At block 1222, the bonded wafers are singulated (e.g., by sawing) to separate individual multi-chip devices that have been formed. Each of the multi-chip devices can be as shown in FIG. 1.

The various operations of blocks of the method 1200 can be repeated and/or omitted to form various multi-chip devices. The method 1200 has been provided as an example of how some multi-chip devices can be formed. In other examples, some operations can be performed in parallel. For example, multiple different wafer stacks can be formed (e.g., by bonding and processing respective wafers) in parallel before the multiple different wafer stacks are then bonded together and further processed to form the multi-chip devices. A person having ordinary skill in the art will readily understand how to form other multi-chip devices based on the description of the method 1200 above.

FIG. 13 is a flowchart of a method 1300 of operating a multi-chip device according to some examples. The multi-chip device can be as shown in any of the foregoing figures, for example. At block 1302, optionally, a chip stack is programmed to instantiate a clock tree in a programmable clock routing network of the chip stack. In foregoing examples, the programmable clock routing network can be programmed with the programming of PL ICs, such as by using a configuration interconnect. The programming can include programming configuration memory to program buffers 614, 622, 624, 626, 628, 714, 716, 720, 724, 1012, 1022, bidirectional buffers 710, multiplexers 1010, 1020, and/or any other programmable element of the programmable clock routing network. Block 1302 can be omitted where the chip stack includes one or more hardwired and/or non-programmable clock trees, for example.

At block 1304, a clock signal is propagated along the clock tree in the chip stack. For example, the clock signal can be generated in a clock source circuit, such as clock source circuit 912, 914, 1112, and propagated through a clock tree 902, 904, 1102 to a leaf level. The clock tree 902, 904, 1102 has in-chip routing contained within one logical chip of the chip stack. The clock tree 902, 904, 1102 is electrically connected to out-of-chip leaf-level connection bridges 922, 924, 1132, as described above.

While the foregoing is directed to specific examples, other and further examples may be devised without departing from the basic scope thereof, and the scope thereof is determined by the claims that follow.

What is claimed is:

1. An integrated circuit (IC) device comprising:
   a chip stack comprising a plurality of IC chips, the plurality of IC chips comprising:
   a first IC chip comprising first leaf nodes;
   a second IC chip comprising second leaf nodes;
   a third IC chip comprising third leaf nodes;
   a first clock tree comprising first in-chip routing within the first IC chip and coupled to the first leaf nodes, wherein a first out-of-chip leaf-level connection bridge couples one of the first leaf nodes with one of the second leaf nodes; and a second clock tree comprising second in-chip routing within the third IC chip and coupled to the third leaf nodes.

2. The IC device of claim 1, wherein the first in-chip routing comprises multiple in-chip routing branches contained within the first IC chip.

3. The IC device of claim 1, wherein the first clock tree further comprises:

a first bidirectional bridge configured to selectively couple the first in-chip routing with a metal stack of the first clock tree.

4. The IC device of claim 3, wherein the first clock tree further comprises:

third in-chip routing within the second IC chip and coupled to the second leaf nodes; and a second bidirectional bridge configured to selectively decouple the third in-chip routing from the metal stack.

5. The IC device of claim 1, wherein the chip stack further comprises a fourth IC chip comprising a clock source circuit connected to the first clock tree within the first IC chip via an out-of-chip routing.

6. The IC device of claim 5, wherein the first clock tree further comprises in-chip distribution tracks disposed within the first IC chip and coupled to the first leaf nodes.

7. The IC device of claim 6, wherein the clock source circuit is coupled to the second leaf nodes via the in-chip distribution tracks, the first leaf nodes, and the first out-of-chip leaf-level connection bridge.

8. The IC device of claim 1, wherein a second out-of-chip leaf-level connection bridge couples one of the third leaf nodes with a leaf node of one of the plurality of IC chips.

9. A method comprising:

propagating a first clock signal along a first clock tree in a chip stack and a second clock signal along a second clock tree in the chip stack, the chip stack comprising a plurality of IC chips, the plurality of IC chips comprising:

a first IC chip comprising first leaf nodes;

a second IC chip comprising second leaf nodes; and a third IC chip comprising third leaf nodes, wherein the first clock tree comprises first in-chip routing within the first IC chip and coupled to the first leaf nodes and the second clock tree comprises second in-chip routing within the third IC chip and coupled to the third leaf nodes, wherein a first out-of-chip leaf-level connection bridge couples one of the first leaf nodes with one of the second leaf nodes.

10. The method of claim 9, wherein the first in-chip routing comprises multiple in-chip routing branches contained within the first IC chip.

11. The method of claim 9 further comprising selectively coupling, via a first bidirectional bridge of the first clock tree, the first in-chip routing with a metal stack of the first clock tree.

12. The method of claim 11 further comprising selectively decoupling, via a second bidirectional bridge of the first clock tree, second in-chip routing within the second IC chip from the metal stack, wherein the second in-chip routing is coupled to the second leaf nodes.

13. The method of claim 9, wherein the chip stack further comprises a fourth IC chip comprising a clock source circuit connected to the first clock tree within the first IC chip via an out-of-chip routing.

14. The method of claim 13, wherein the first clock tree further comprises in-chip distribution tracks disposed within the first IC chip and coupled to the first leaf nodes.

15. The method of claim 14, wherein the clock source circuit is coupled to the second leaf nodes via the in-chip distribution tracks, the first leaf nodes, and the first out-of-chip leaf-level connection bridge.

16. The method of claim 9, wherein a second out-of-chip leaf-level connection bridge couples one of the third leaf nodes with a leaf node of one of the plurality of IC chips.

17. An integrated circuit (IC) device comprising:

a first IC chip comprising first leaf nodes and second leaf nodes; and a first clock tree comprising first in-chip routing within the first IC chip and coupled to the first leaf nodes, wherein a first out-of-chip leaf-level connection bridge couples the first leaf nodes with third leaf nodes of a second IC chip and a second out-of-chip leaf-level connection bridge couples the second leaf nodes with a second clock tree of a third IC chip.

18. The IC device of claim 17, wherein the first in-chip routing comprises multiple in-chip routing branches contained within the first IC chip.

19. The IC device of claim 17, wherein the first clock tree further comprises:

a metal stack;

a first bidirectional bridge configured to selectively couple the first in-chip routing with the metal stack;

second in-chip routing within the second IC chip and coupled to the second leaf nodes; and a second bidirectional bridge configured to selectively decouple the second in-chip routing from the metal stack.

20. The IC device of claim 17 further comprising:

a fourth IC chip comprising a clock source circuit connected to the first clock tree within the first IC chip via an out-of-chip routing, wherein the first clock tree further comprises in-chip distribution tracks disposed within the first IC chip and coupled to the first leaf nodes, and wherein the clock source circuit is coupled to the leaf nodes via the in-chip distribution tracks, the first leaf nodes, and the first out-of-chip leaf-level connection bridge.

* * * * *